(12) United States Patent
Okuno

(10) Patent No.: US 10,573,515 B2
(45) Date of Patent: Feb. 25, 2020

(54) PRODUCTION METHOD FOR SEMICONDUCTOR

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/922,714

(22) Filed: Mar. 15, 2018

(65) Prior Publication Data
US 2018/0286671 A1    Oct. 4, 2018

(30) Foreign Application Priority Data
Mar. 29, 2017    (JP) ................. 2017-066405

(51) Int. Cl.
*H01L 21/02*    (2006.01)
*H01L 21/683*   (2006.01)
(Continued)

(52) U.S. Cl.
CPC .... *H01L 21/02458* (2013.01); *H01L 21/0242* (2013.01); *H01L 21/0254* (2013.01);
(Continued)

(58) Field of Classification Search
CPC ....... H01L 33/13; H01L 33/007; H01L 33/38; H01L 33/06; H01L 33/32
See application file for complete search history.

(56) References Cited

U.S. PATENT DOCUMENTS 6,946,370 B2    9/2005  Koike et al.
8,698,163 B2 *  4/2014  Ting ................. H01L 21/02458
                                                        257/13
(Continued)

FOREIGN PATENT DOCUMENTS

JP    2003-055097 A   2/2003
JP       3823775 B    9/2006
(Continued)

*Primary Examiner* — Kyoung Lee
*Assistant Examiner* — Christina A Sylvia
(74) *Attorney, Agent, or Firm* — McGinn IP Law Group, PLLC

(57) ABSTRACT

There is provided a method for producing a semiconductor device, the method facilitating removal of a growth substrate from a semiconductor layer. A decomposition layer formation step involves extension of a plurality of threading dislocations during growth of a decomposition layer. A bridging portion formation step involves exposure of the threading dislocations to the surface of a bridging portion. A decomposition step involves widening of the threading dislocations exposed to the surface of the bridging portion, to thereby provide a plurality of through holes penetrating the bridging portion; decomposition of at least a portion of the decomposition layer exposed in the interior of the through holes; and discharge of a decomposition product generated through decomposition of the decomposition layer via the through holes to the outside of the bridging portion, to thereby provide a first void in a portion of a region where the decomposition layer has remained.

19 Claims, 20 Drawing Sheets

(51) Int. Cl.
*H01L 29/778* (2006.01)
*H01L 33/06* (2010.01)
*H01L 33/14* (2010.01)
*H01L 29/205* (2006.01)
*H01L 33/00* (2010.01)
*H01L 33/32* (2010.01)
*H01L 29/20* (2006.01)
*H01L 33/42* (2010.01)

(52) U.S. Cl.
CPC .... *H01L 21/02502* (2013.01); *H01L 21/6835* (2013.01); *H01L 29/205* (2013.01); *H01L 29/7787* (2013.01); *H01L 33/0066* (2013.01); *H01L 33/0079* (2013.01); *H01L 33/06* (2013.01); *H01L 33/14* (2013.01); *H01L 21/0262* (2013.01); *H01L 21/02631* (2013.01); *H01L 29/2003* (2013.01); *H01L 33/32* (2013.01); *H01L 33/42* (2013.01); *H01L 2221/6835* (2013.01); *H01L 2221/68318* (2013.01); *H01L 2221/68345* (2013.01)

(56) References Cited

U.S. PATENT DOCUMENTS

| | | | |
|---|---|---|---|
| 2004/0241966 | A1 | 12/2004 | Koike et al. |
| 2009/0197118 | A1* | 8/2009 | Nagai ............ C30B 25/18 428/698 |
| 2011/0233519 | A1* | 9/2011 | Cheng ............ H01L 21/0237 257/15 |
| 2014/0235037 | A1* | 8/2014 | Morita ............ C30B 25/02 438/478 |
| 2014/0339565 | A1* | 11/2014 | Choi ............ H01L 21/0237 257/76 |
| 2016/0149073 | A1* | 5/2016 | Shu ............ H01L 33/06 257/13 |

FOREIGN PATENT DOCUMENTS

| | | |
|---|---|---|
| JP | 4035971 B2 | 1/2008 |
| WO | WO 03/021012 A1 | 3/2003 |

* cited by examiner

PRODUCTION METHOD FOR SEMICONDUCTOR

BACKGROUND OF THE INVENTION

Field of the Invention

The technique disclosed in the present specification relates to a method for producing a semiconductor.

Background Art

In general, the production of a semiconductor involves growth of a semiconductor layer on a growth substrate. In the case where the material of the growth substrate differs from that of the semiconductor layer, a strain or a lattice defect (due to a lattice mismatch) may occur at the interface between the growth substrate and the semiconductor layer. The occurrence of a strain may cause poor crystallinity of the semiconductor layer. The strain also causes an internal stress in the semiconductor layer. The internal stress in the semiconductor layer generates a piezoelectric field. The piezoelectric field affects the behavior of electrons in the semiconductor device. Therefore, desirably, the strain in the semiconductor layer is relaxed.

In view of the foregoing, there has been developed a technique for removing the growth substrate after growth of the semiconductor layer. For example, Patent Document 1 discloses a method for producing a semiconductor substrate, the method including a step of forming a first nitride semiconductor layer having a T-shaped cross section, and a step of removing a protective film while a portion of the protective film is left on the opposite surfaces of a T-shaped column.

Patent Document 1: Japanese Patent Application Laid-Open (kokai) No. 2003-055097

The area of a bonding region between the semiconductor layer and the substrate is preferably small, so that the substrate can be readily removed from the semiconductor layer, and the semiconductor layer can be prevented from receiving an impact caused by removal of the substrate.

SUMMARY OF THE INVENTION

The technique disclosed in the present specification has been accomplished for solving problems involved in the aforementioned conventional technique. Accordingly, an object of the technique disclosed in the present specification is to provide a method for producing a semiconductor device, the method facilitating removal of a growth substrate from a semiconductor layer.

In a first aspect of the present invention, there is provided a method for producing a semiconductor, the method comprising:

forming a decomposition layer above a substrate;
forming a bridging portion on the decomposition layer;
decomposing the decomposition layer; and
forming at least one semiconductor layer on the bridging portion. The forming of the decomposition layer extends a plurality of threading dislocations during growth of the decomposition layer. The forming of the bridging portion exposes the threading dislocations to the surface of the bridging portion. The decomposing of the decomposition layer widens the threading dislocations exposed to the surface of the bridging portion, to thereby provide a plurality of through holes penetrating the bridging portion; decomposes at least a portion of the decomposition layer exposed through the through holes; and discharges a decomposition product generated through decomposition of the decomposition layer via the through holes to the outside of the bridging portion, to thereby provide a void in at least a portion of the decomposition layer.

In the semiconductor production method, easily decomposable portions of the threading dislocations in the bridging portion are widened to thereby provide a plurality of through holes. The decomposition layer exposed in the interior of the through holes is then decomposed. Accordingly, at least a portion of the decomposition layer is removed without removal of the bridging portion, whereby a first void is provided. Thus, the substrate can be readily separated from the bridging portion. No problem occurs even if the semiconductor layer is formed to a slight extent on the substrate. The term "substrate" refers not to a template substrate, but to a substrate of single composition. The decomposition product includes Ga gas, Ga droplets, GaN gas, or a gas of by-products.

A second aspect of the invention is directed to a specific embodiment of the semiconductor production method of the first aspect, the method further comprising: forming a protective layer. The forming of the decomposition layer involves formation of the decomposition layer on the protective layer. The decomposing of the decomposition layer involves decomposition of at least a portion of the decomposition layer disposed between the bridging portion and the protective layer.

A third aspect of the invention is directed to a specific embodiment of the semiconductor production method of the first aspect, the method further comprising: forming a pit layer having a pit, and forming, on the pit layer, a protective layer having a shape corresponding to a shape of the pit. The forming of the decomposition layer involves formation of the decomposition layer on the protective layer. The decomposing of the decomposition layer involves decomposition of at least a portion of the decomposition layer disposed between the bridging portion and the protective layer.

A fourth aspect of the invention is directed to a specific embodiment of the semiconductor production method of the first aspect, the method further comprising: forming a protective layer; and forming a dent in the decomposition layer. The forming of the decomposition layer involves formation of the decomposition layer on the protective layer. The forming of the dent involves formation of a dent having a side portion and a bottom portion in the decomposition layer. The forming of the bridging portion involves formation of a bridging portion having a shape corresponding to a shape of the dent.

A fifth aspect of the invention is directed to a specific embodiment of the semiconductor production method of the first aspect, the method further comprising: forming a flat protective film. The forming of the decomposition layer involves formation of a flat decomposition layer on the protective film. The forming of the bridging portion involves formation of a flat bridging portion on the decomposition layer.

A sixth aspect of the invention is directed to a specific embodiment of the semiconductor production method of the first aspect, wherein the forming of the bridging portion involves formation of a flat bridging portion on the decomposition layer.

A seventh aspect of the invention is directed to a specific embodiment of the semiconductor production method of the first aspect, the method further comprising: forming a pit layer having a pit; and forming, on the pit layer, a protective layer having a shape corresponding to a shape of the pit. The forming of the decomposition layer involves formation of a flat decomposition layer on the protective layer. The forming of the bridging portion involves formation of a flat bridging portion on the decomposition layer.

An eighth aspect of the invention is directed to a specific embodiment of the semiconductor production method of the first aspect, the method further comprising: forming a pit layer having a pit; and forming, on the pit layer, a protective layer having a shape corresponding to a shape of the pit. The forming of the decomposition layer involves formation, on the protective layer, of a decomposition layer having a shape corresponding to a shape of the protective layer. The forming of the bridging portion involves formation, on the decomposition layer, of a bridging portion having a shape corresponding to a shape of the decomposition layer.

A ninth aspect of the invention is directed to a specific embodiment of the semiconductor production method of the first aspect, the method further comprising: forming a flat protective layer. The forming of the decomposition layer involves formation of a decomposition layer having a pit on the protective layer. The forming of the bridging portion involves formation, on the decomposition layer, of a bridging portion having a shape corresponding to a shape of the decomposition layer.

A tenth aspect of the invention is directed to a specific embodiment of the semiconductor production method of the first aspect, wherein the forming of the decomposition layer involves formation of a decomposition layer having a pit; and the forming of the bridging portion involves formation, on the decomposition layer, of a bridging portion having a shape corresponding to a shape of the decomposition layer.

An eleventh aspect of the invention is directed to a specific embodiment of the semiconductor production method of the first aspect, the method further comprising: forming a flat protective layer; and forming a dent in the decomposition layer. The forming of the decomposition layer involves formation of the decomposition layer on the protective layer. The forming of the dent involves formation of a dent having a side portion and a bottom portion in the decomposition layer so as not to expose the protective layer through the bottom portion. The forming of the bridging portion involves formation of a bridging portion having a shape corresponding to the dent.

A twelfth aspect of the invention is directed to a specific embodiment of the semiconductor production method of the first aspect, the method further comprising: forming a flat protective layer; and forming a dent in the decomposition layer. The forming of the decomposition layer involves formation of the decomposition layer on the protective layer. The forming of the dent involves formation of a dent having a side portion and a bottom portion in the decomposition layer so as to expose the protective layer through the bottom portion. The forming of the bridging portion involves formation of a bridging portion having a shape corresponding to the dent.

A thirteenth aspect of the invention is directed to a specific embodiment of the semiconductor device production method of the first aspect, the method further comprising forming a dent in the decomposition layer. The forming of the dent involves formation of a dent having a side portion and a bottom portion in the decomposition layer. The forming of the bridging portion involves formation of a bridging portion having a shape corresponding to the dent.

A fourteenth aspect of the invention is directed to a specific embodiment of the semiconductor production method of the first aspect, the method further comprising: forming a dent having a side portion and a bottom portion in the decomposition layer, and causing damage to the side portion of the dent.

A fifteenth aspect of the invention is directed to a specific embodiment of the semiconductor production method of the first aspect, the method comprising: providing a template substrate having a decomposition layer.

A sixteenth aspect of the invention is directed to a specific embodiment of the semiconductor production method of the first aspect, wherein the decomposition layer is a GaN layer or an InGaN layer, and the bridging portion is formed of an Al-containing Group III nitride semiconductor layer.

A seventeenth aspect of the invention is directed to a specific embodiment of the semiconductor production method of the first aspect, the method further comprising: separating the substrate from the semiconductor layer.

In the all aspects described above, the semiconductor involves a semiconductor layer or a semiconductor device. In the present specification, there is provided a method for producing a semiconductor, the method facilitating removal of a growth substrate from a semiconductor layer.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
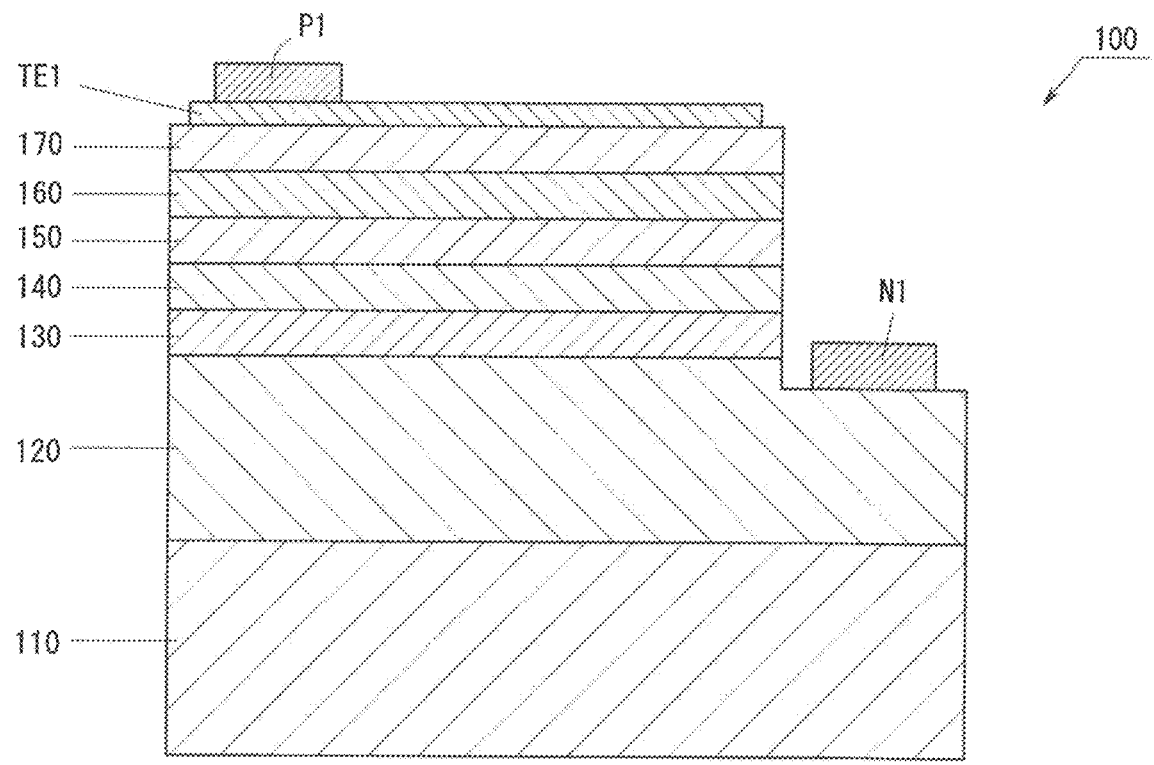
FIG. 1 schematically shows the configuration of a first semiconductor device (light-emitting device) of a first embodiment.

Specific embodiments will next be described with reference to the drawings by taking, as an example, a method for producing a semiconductor device. However, the technique disclosed in the present specification should not be limited to these embodiments. In the below-described semiconductor device, the layered structure of each layer and the structure of each electrode are shown for an exemplary purpose. Needless to say, the layered structure may differ from that described below in the embodiments. The thickness proportion of each layer which is schematically shown in the drawings does not correspond to its actual value.

First Embodiment

1. Semiconductor Device 1-1. First Semiconductor Device (Semiconductor Light-Emitting Device)

FIG. 1 schematically shows the configuration of a first semiconductor device. The first semiconductor device is a light-emitting device 100. The light-emitting device 100 includes a GaN substrate 110, an n-type contact layer 120, an n-side electrostatic breakdown preventing layer 130, an n-side superlattice layer 140, a light-emitting layer 150, a p-side cladding layer 160, a p-type contact layer 170, a transparent electrode TE1, an n-electrode N1, and a p-electrode P1.

Each of the n-type contact layer 120, the n-side electrostatic breakdown preventing layer 130, and the n-side superlattice layer 140 is an n-type semiconductor layer. The n-type semiconductor layer may include, for example, an ud-GaN layer that is not doped with a donor. Each of the p-side cladding layer 160 and the p-type contact layer 170 is a p-type semiconductor layer. The p-type semiconductor layer may include, for example, an ud-GaN layer that is not doped with an acceptor.

The n-type contact layer 120 is in direct contact with the n-electrode N1. The n-side electrostatic breakdown preventing layer 130 is provided for preventing the electrostatic breakdown of each semiconductor layer. The n-side superlattice layer 140 serves as a strain relaxation layer for relaxing a stress applied to the light-emitting layer 150. The light-emitting layer 150 emits light through recombination of electrons and holes. The p-side cladding layer 160 is provided for confining carriers in the light-emitting layer 150. The p-type contact layer 170 is provided for achieving ohmic contact with the transparent electrode TE1. The transparent electrode TE1 is provided for diffusing current in the light-emitting surface.

The n-type contact layer 120 is formed of, for example, n-type GaN. The n-side electrostatic breakdown preventing layer 130 includes, for example, an ud-GaN (unintentionally doped GaN) layer and an n-type GaN layer. The n-side superlattice layer 140 is formed through repeated stacking of, for example, an InGaN layer and a GaN layer. The light-emitting layer 150 includes a well layer and a barrier layer. The well layer and the barrier layer may be formed of AlInGaN, such as InGaN, GaN, or AlGaN. The p-side cladding layer 160 is formed through repeated stacking of, for example, a p-type AlGaN layer and a p-type InGaN layer. The p-type contact layer 170 is formed of, for example, p-type GaN. The transparent electrode TE1 is formed of, for example, any of ITO, IZO, ICO, ZnO, $TiO_2$, $NbTiO_2$, $TaTiO_2$, and $SnO_2$.

1-2. Second Semiconductor Device (HEMT)

Figure 2:
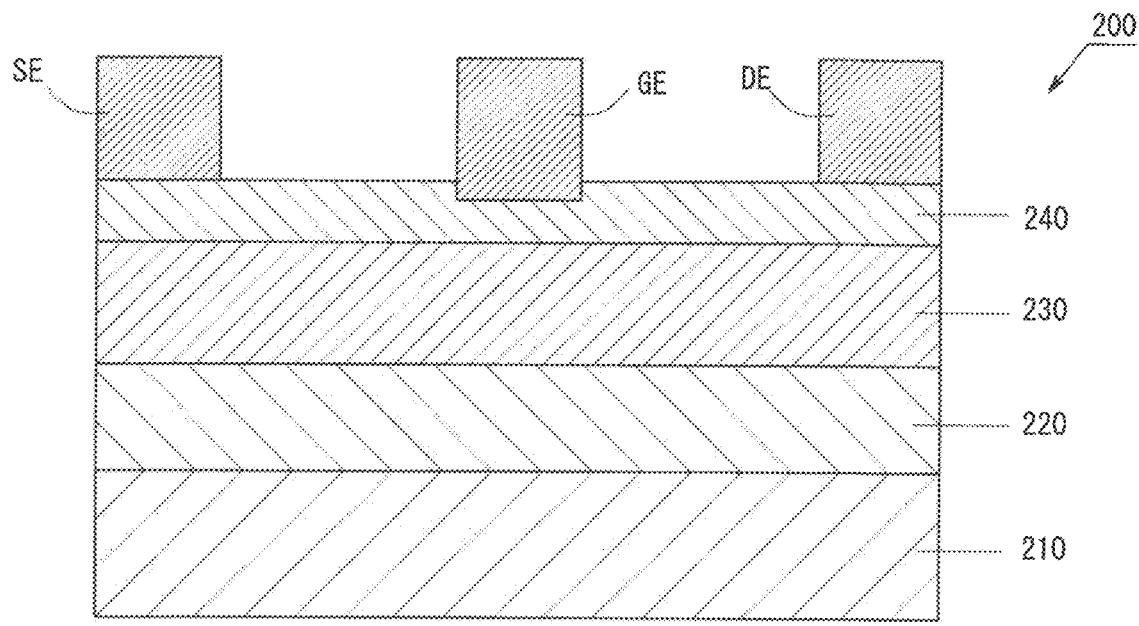
FIG. 2 schematically shows the configuration of a second semiconductor device (HEMT) of the first embodiment.

FIG. 2 schematically shows the configuration of a second semiconductor device. The second semiconductor device is a HEMT 200. The HEMT 200 includes a GaN substrate 210, an underlying layer 220, a carrier traveling layer 230, a carrier supply layer 240, a gate electrode GE, a source electrode SE, and a drain electrode DE. The source electrode SE and the drain electrode DE are formed on the carrier supply layer 240.

The underlying layer 220 is, for example, a GaN layer. The carrier traveling layer 230 is formed of, for example, GaN. The carrier supply layer 240 is formed of, for example, AlGaN.

1-3. Other Semiconductor Devices

The layered structures and materials of the aforementioned first and second semiconductor devices are shown for an exemplary purpose. Thus, the semiconductor device may have any other configuration. The semiconductor device may be, for example, a flip-chip type or vertical conduction type light-emitting device. Alternatively, the semiconductor device may be another device, such as IGBT or MOSFET.

2. Production Method for Semiconductor Device

Example 1-1

In the present example, the decomposition layer is etched using threading dislocations. Now will be described a semiconductor production method, for example, the method for producing the first semiconductor device (light-emitting device 100). The production method can be also applied to the second semiconductor device (HEMT 200). Semiconductor layers can be formed through, for example, MOCVD. Alternatively, semiconductor layers may be formed by MBE (Molecular Beam Epitaxy), vapor-phase growth process (e.g., HVPE). Target semiconductor layers may be formed by a liquid-phase growth process.

2-1. Step of Providing Substrate

Figure 3:
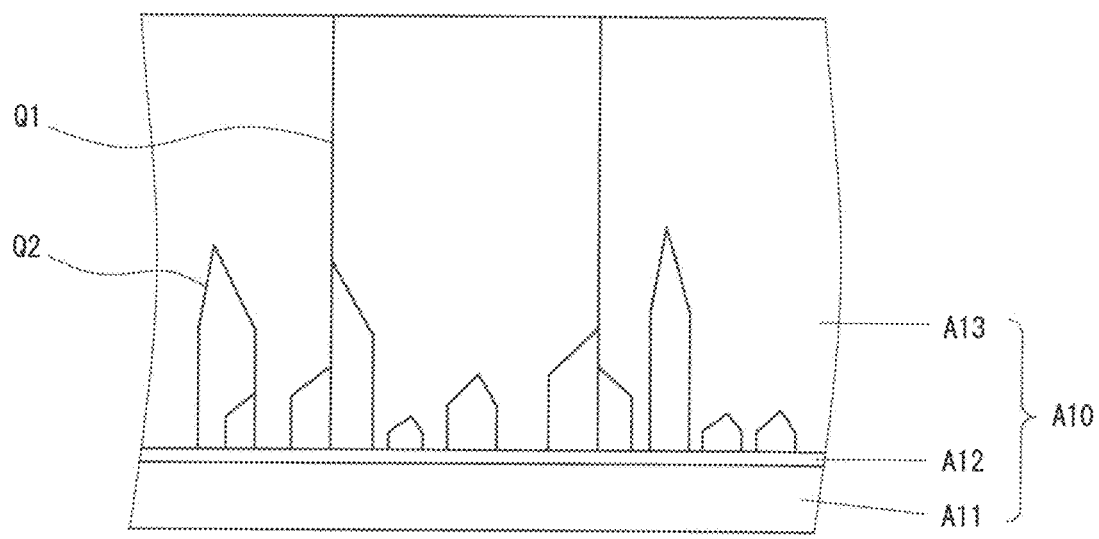
FIG. 3 illustrates a production method for the semiconductor device of the first embodiment (part 1)

Firstly, a substrate A10 is provided as shown in FIG. 3. The substrate A10 is a template substrate. The substrate A10 includes a sapphire substrate A11, a low-temperature formed buffer layer A12, and a GaN layer A13. As shown in FIG. 3, dislocations Q2 appropriately converge and no longer extend in the GaN layer A13. Thus, the GaN layer A13 exhibits a low dislocation density in a region away from the sapphire substrate A11. That is, a region of the GaN layer A13 proximal to the sapphire substrate A11 exhibits a high dislocation density, whereas a region of the GaN layer A13 distal to the sapphire substrate A11 exhibits a low dislocation density. The region of the GaN layer A13 exhibiting a low dislocation density has excellent semiconductor crystallinity.

2-2. Step of Forming Protective Layer

Figure 4:
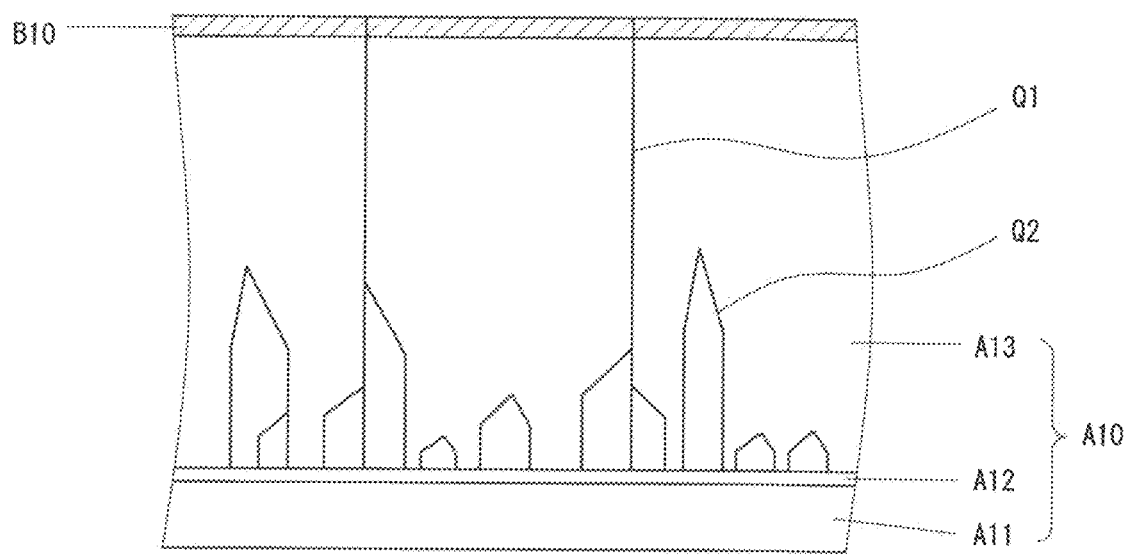
FIG. 4 illustrates the production method for the semiconductor device of the first embodiment (part 2)

Subsequently, a protective layer B10 is formed on the GaN layer A13 in a uniform thickness as shown in FIG. 4. In this case, threading dislocations Q1 extend through the protective layer B10. The protective layer B10 is provided for preventing the below-described decomposition from occurring in a layer below the protective layer B10. The protective layer B10 is a flat semiconductor layer. The protective layer B10 is, for example, an AlGaN layer. The thermal decomposition temperature of the protective layer B10 of AlGaN is sufficiently higher than that of the below-described decomposition layer C10.

2-3. Step of Forming Decomposition Layer

Figure 5:
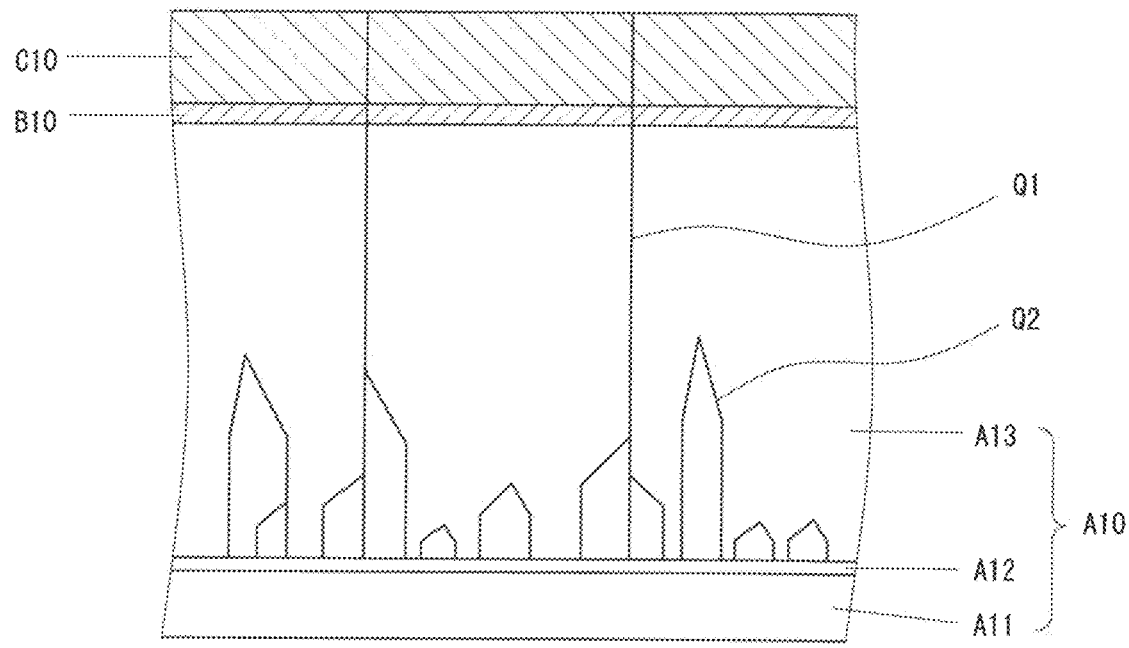
FIG. 5 illustrates the production method for the semiconductor device of the first embodiment (part 3)

Subsequently, as shown in FIG. 5, a decomposition layer C10 is formed on the protective layer B10. The top surface of the decomposition layer C10 is flat. In this case, the threading dislocations Q1 extend through the decomposition layer C10. The decomposition layer C10 is formed of InGaN. The decomposition layer C10 of InGaN is thermally decomposed at a relatively low temperature. The thus-formed decomposition layer C10 is partially removed through a decomposition step described below.

2-4. Step of Forming Bridging Portion

Figure 6:
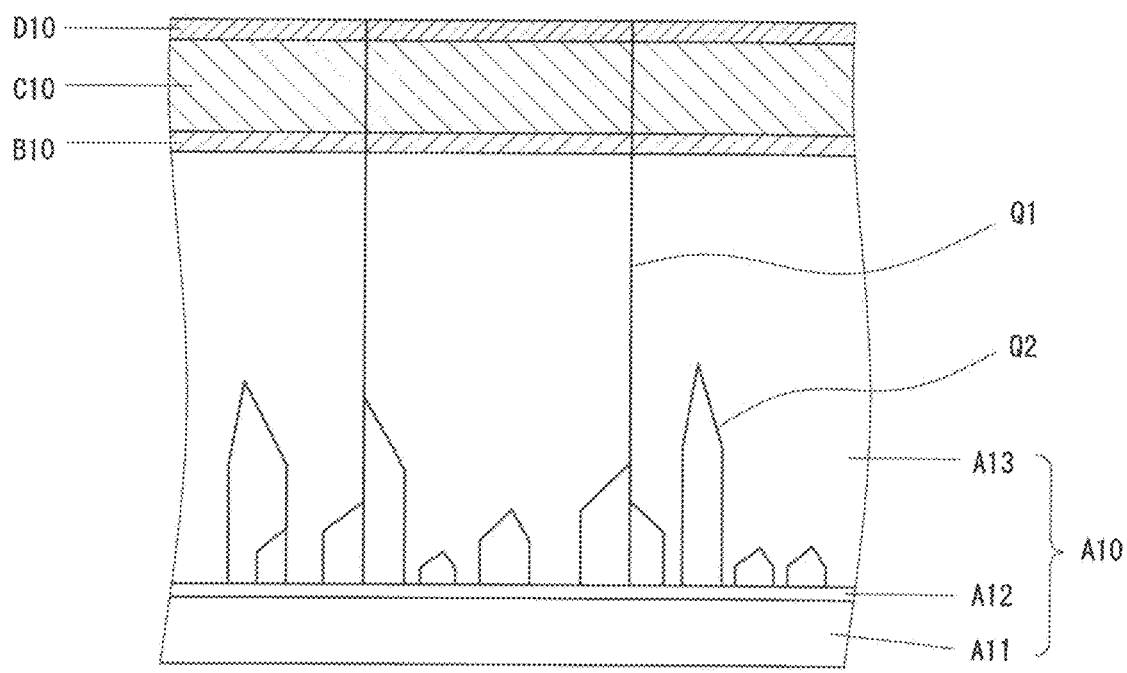
FIG. 6 illustrates the production method for the semiconductor device of the first embodiment (part 4)

Subsequently, a bridging portion D10 is formed on the decomposition layer C10 with a uniform thickness as shown in FIG. 6. The top surface of the bridging portion D10 is flat. In this case, the threading dislocations Q1 extend through the bridging portion D10. The threading dislocations Q1 are then exposed to the surface of the bridging portion D10. The bridging portion D10 is formed of AlGaN.

The bridging portion D10 has a thickness of 0.25 nm to 100 nm, preferably 0.5 nm to 60 nm, more preferably 1 nm to 30 nm. The thickness of the bridging portion D10 may be equal to or greater than a level such that the bridging portion D10 can support the semiconductor layer E10 to be formed thereon. If the bridging portion D10 has a large thickness, the below-described decomposition step requires a long period of time. The preferred thickness depends on the material of the bridging portion D10. If the bridging portion D10 contains Al, the bridging portion D10 has a large lattice mismatch with the decomposition layer. The thermal decomposition temperature of the bridging portion D10 is higher than that of the decomposition layer C10. The bridging portion D10 preferably has a thickness smaller than that of the protective layer B10 for the following reason. If the bridging portion D10 has a larger thickness, through holes are less likely to be provided in the below-described decomposition step. If the protective layer B10 has a smaller thickness, it is difficult that the protective layer B10 stops the decomposition of the decomposition layer C10. The Al composition ratio of the bridging portion D10 is preferably smaller than that of the protective layer B10 for the following reason. If the bridging portion D10 has a larger Al composition ratio, through holes are less likely to be provided in the below-described decomposition step. If the protective layer B10 has a smaller Al composition ratio, it is difficult that the protective layer B10 stops the decomposition of the decomposition layer C10.

2-5. Decomposition Step

Figure 7:
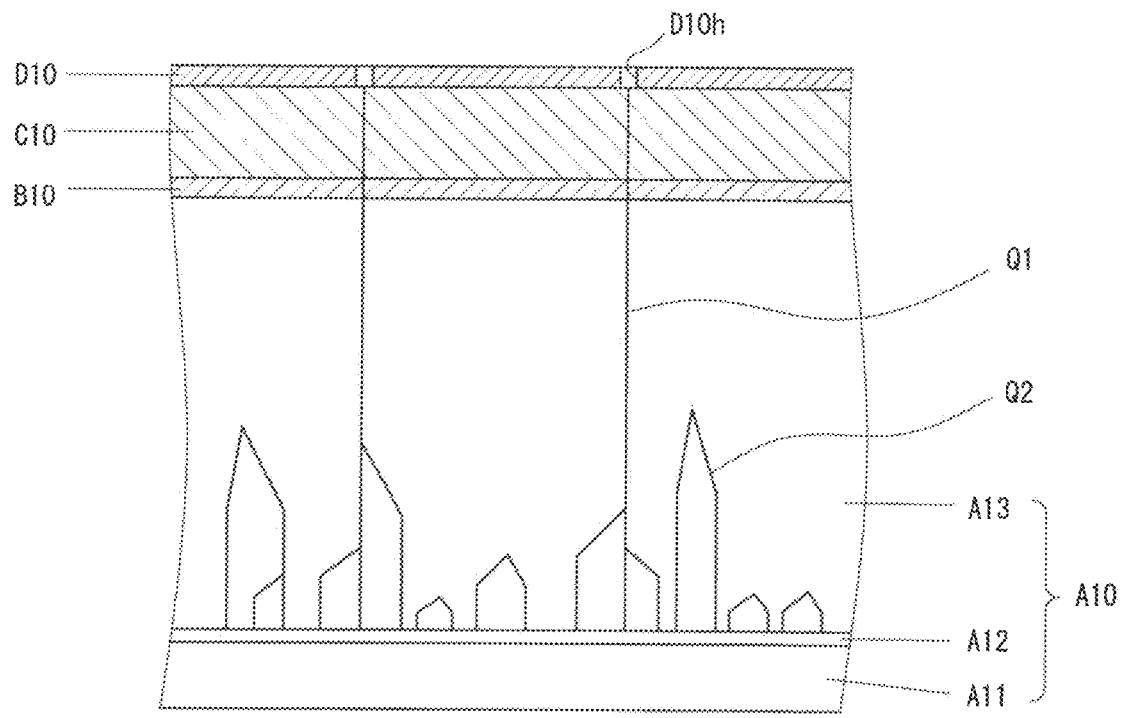
FIG. 7 illustrates the production method for the semiconductor device of the first embodiment (part 5)

Subsequently, the decomposition layer C10 is decomposed as shown in FIG. 7. A gas mixture containing $H_2$ gas and at least one of $N_2$ gas and $NH_3$ gas is supplied for the decomposition. The substrate temperature is adjusted to a temperature equal to or higher than the thermal decomposition temperature of the decomposition layer C10 and lower than the thermal decomposition temperatures of the bridging portion D10 and the protective layer B10. The threading dislocations Q1 are lattice defects due to breakage of interatomic bonds. Accordingly, the decomposition of the semiconductor is likely to occur from the threading dislocations Q1. Thus, even if the semiconductor material of the bridging portion D10 has the thermal decomposition temperature higher than the substrate temperature at decomposition, the decomposition of the semiconductor occurs from the threading dislocations Q1. Therefore, the surface of the bridging portion D10 is etched from the threading dislocations Q1. Consequently, through holes D10h are formed in the bridging portion D10. The gas mixture widens the threading dislocations Q1 exposed to the surface of the bridging portion D10, to thereby provide the through holes D10h penetrating the bridging portion D10. Thus, the decomposition layer C10 is exposed through the through holes D10h.

Figure 8:
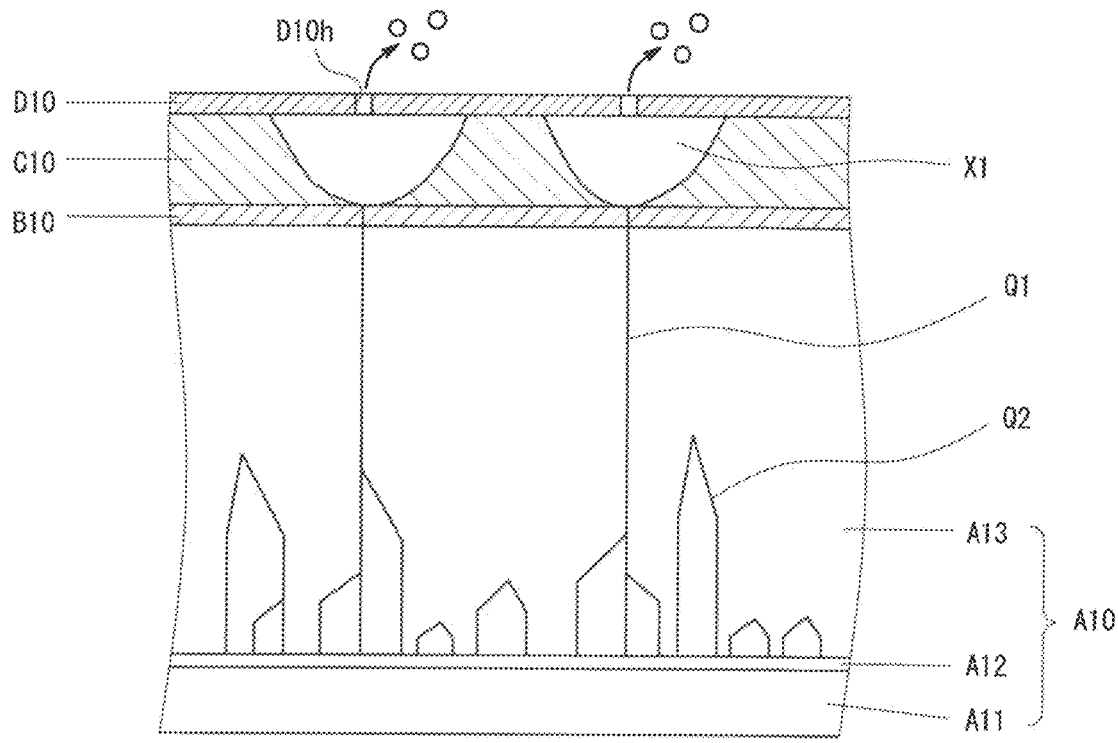
FIG. 8 illustrates the production method for the semiconductor device of the first embodiment (part 6)

As shown in FIG. 8, the gas mixture decomposes at least a portion of the decomposition layer C10 exposed through the through holes D10h. The decomposition layer C10 is thermally decomposed and etched by means of $H_2$ gas. Decomposition products generated through decomposition of the decomposition layer C10 are discharged via the through holes D10h to the outside of the bridging portion D10. At this time an etch rate of the through holes D10*h* of the bridging portion D10 is smaller than an etch rate of the decomposition layer C10. Accordingly the bridging portion D10 is not decomposed except the through holes D10*h*. The etch rate of the decomposition layer C10 is larger than an etch rate of the threading dislocations Q1 of the protective layer B10 because of the higher Al composition ratio, the higher decomposition temperature and the larger thickness of the protective layer B10. The decomposition layer C10 is more likely to be decomposed than the threading dislocations Q1 of the protective layer B10. Accordingly, the decomposition layer C10 is relatively readily decomposed, but the protective layer B10 are barely decomposed. In the result, at least a portion of the decomposition layer C10 disposed between the bridging portion D10 and the protective layer B10 is decomposed.

Figure 9:
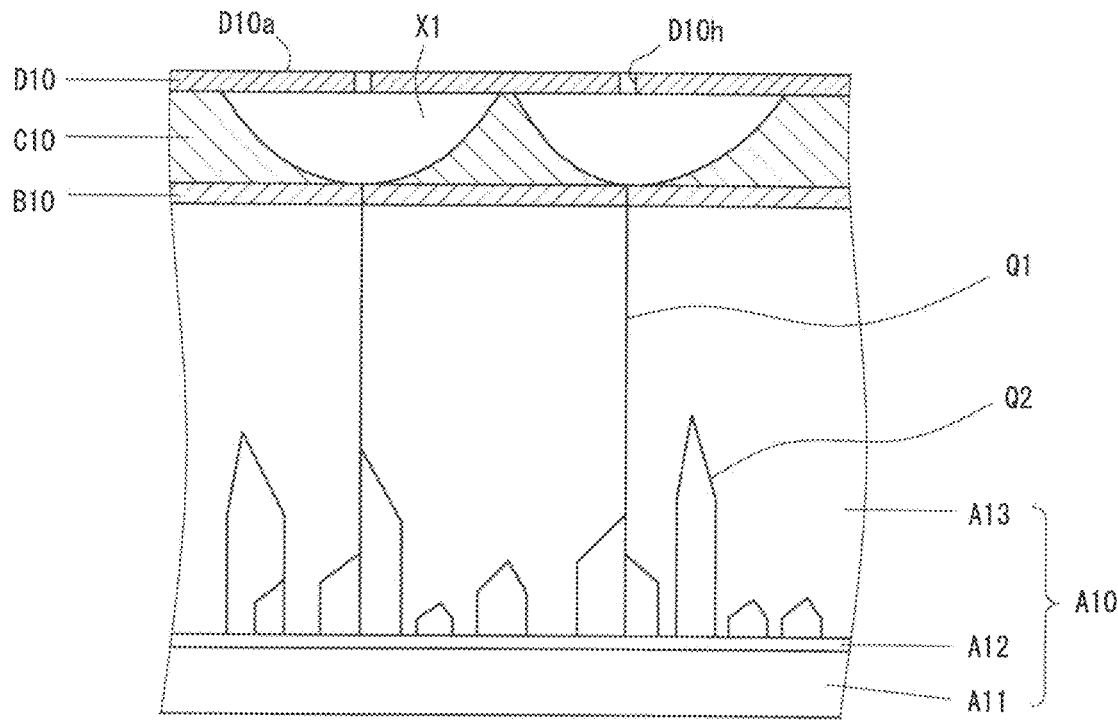
FIG. 9 illustrates the production method for the semiconductor device of the first embodiment (part 7)

As shown in FIG. 9, the decomposition layer C10 is further etched. Since the bridging portion D10 is not thermally decomposed, the bridging portion D10, which has the through holes D10*h*, remains after the etching. Thus, voids X1 are provided in the decomposition layer C10 beneath the through holes D10*h*. Each of the voids X1 is defined by the non-decomposed (remaining) portion of the decomposition layer C10 and the bridging portion D10. In this stage, a connection portion between the decomposition layer C10 and the bridging portion D10 has a sufficiently small width.

$H_2$ gas contained in the gas mixture generally etches the decomposition layer C10. Thus, the partial pressure of $H_2$ gas is preferably increased. However, the supply of $H_2$ gas alone may cause leaching of Ga metal in the form of droplets. Therefore, at least one of $N_2$ gas and $NH_3$ gas is preferably supplied in addition to $H_2$ gas. More preferably, a gas mixture of $H_2$ and $NH_3$ is supplied. The ratio (by volume) of the total amount of $N_2$ and $NH_3$ to the total amount of all the gases is preferably 0.1% to 10%, more preferably 0.1% to 5.0%, still more preferably 0.1% to 2.5%.

2-6. Step of Forming Semiconductor Layer

Figure 10:
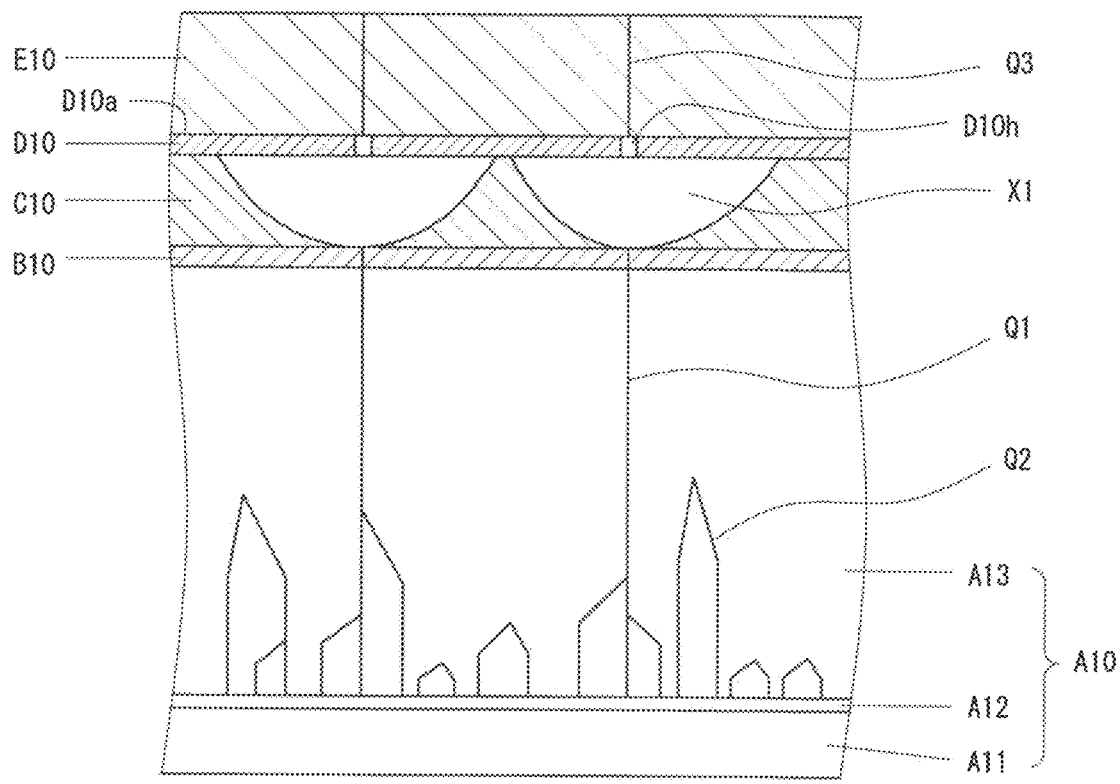
FIG. 10 illustrates the production method for the semiconductor device of the first embodiment (part 8)

Subsequently, a semiconductor layer E10 is grown on the bridging portion D10 as shown in FIG. 10. The semiconductor layer E10 includes one or more semiconductor layers. The semiconductor layer E10 is grown from the top surface D10*a* of the bridging portion D10. Thus, the semiconductor layer E10 appropriately fills the through holes D10*h* of the bridging portion D10; i.e., the through holes D10*h* provided in the bridging portion D10 are blocked. In some cases, new threading dislocations Q3 may generate from the through holes D10*h* of the bridging portion D10. Alternatively, no threading dislocations may generate from the through holes D10*h* of the bridging portion D10.

The semiconductor layer E10 corresponds to the GaN substrate 110 shown in FIG. 1. Thus, the semiconductor layer E10 is formed of GaN. Thereafter, on the semiconductor layer E10 are formed an n-type contact layer 120, an n-side electrostatic breakdown preventing layer 130, an n-side superlattice layer 140, a light-emitting layer 150, a p-side cladding layer 160, and a p-type contact layer 170.

2-7. Step of Forming Electrode

Subsequently, a transparent electrode TE1 is formed on a portion of the p-type contact layer 170. A dent is then formed in the remaining portion (i.e., a portion on which the transparent electrode TE1 is not formed) of the p-type contact layer 170. The n-type contact layer 120 is exposed through the bottom of the dent. An n-electrode N1 is then formed on the n-type contact layer 120. A p-electrode P1 is formed on the transparent electrode TE1.

2-8. Step of Separating Substrate

Subsequently, the substrate A10 is separated from the semiconductor layers. Before this step, the bridging portion D10 is in slight contact with the decomposition layer C10. Thus, the bridging portion D10 is readily separated from the decomposition layer C10. The bridging portion D10 can be manually separated from the decomposition layer C10 by the operator. Spontaneous separation may readily occur. The separation step may be performed through etching, a tape lift-off process, or an ultrasonic process. In many cases, the separation step by using a specific machine is not necessarily performed.

2-9. Polishing Step

In this stage, the bridging portion D10 remains on the bottom of the GaN substrate 110 of the light-emitting device 100. Thus, the bridging portion D10 is removed through polishing. The light-emitting device 100 is thereby produced.

3. Effects of First Embodiment

The substrate A10 can be readily separated from the semiconductor layers E10 etc., since the connection region between the bridging portion D10 and the decomposition layer C10 is very narrow. Because the substrate A10 exhibits good crystallinity, the light-emitting device 100, to which the crystallinity of the substrate A10 is transferred, also exhibits good crystallinity. The substrate A10, which is separated through the substrate separation step, can be reused later. Once the substrate A10 exhibiting good crystallinity is prepared, the light-emitting device 100 of high quality can be repeatedly produced by use of the substrate A10.

4. Modifications 4-1. Order of Substrate Separation Step

In the above embodiment, the substrate A10 is separated from the light-emitting device 100 after the production of the light-emitting device 100 on the GaN substrate 110. However, the semiconductor layers may be formed on the GaN substrate 110 after the separation of the GaN substrate 110 from the substrate A10.

4-2. Omission of Substrate Separation Step

Example 1-2

Figure 11:
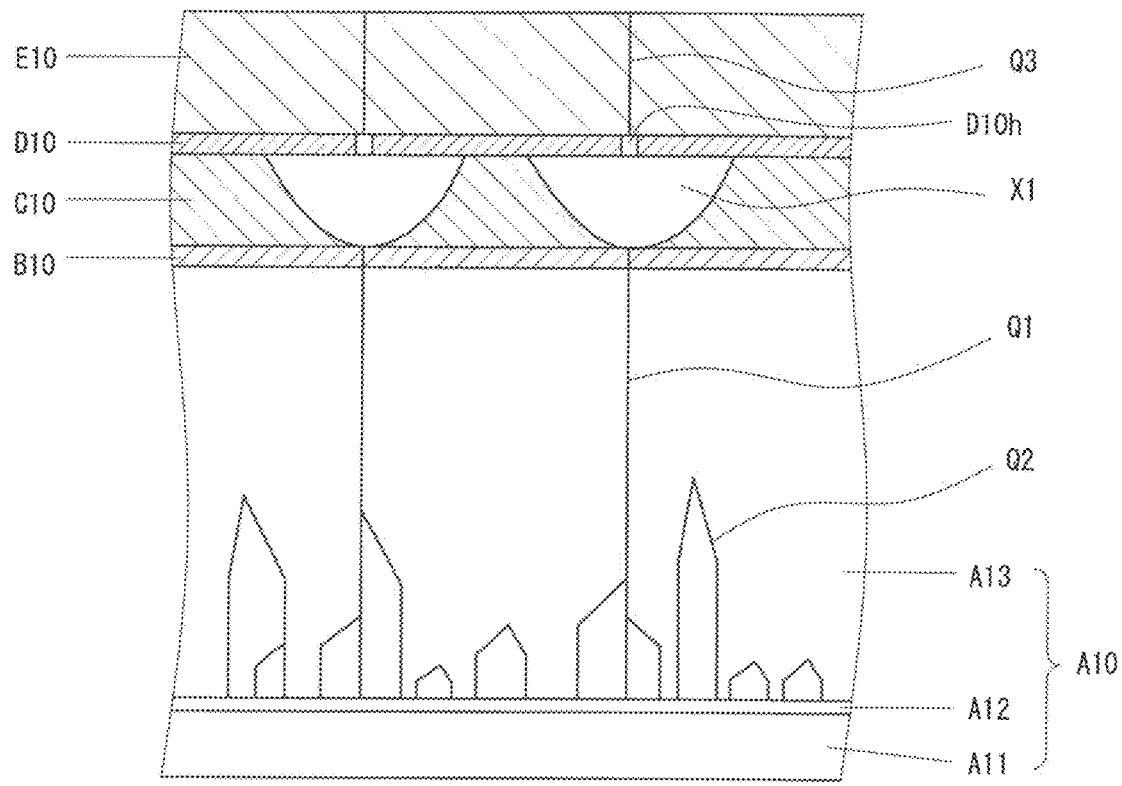
FIG. 11 illustrates a production method for a semiconductor device according to a modification of the first embodiment (part 1)

In the present example, the substrate A10 is not separated from the semiconductor layer E10. As shown in FIG. 11, the semiconductor layer E10 is formed on the bridging portion D10 at a stage where the decomposition layer C10 is not sufficiently decomposed. In such a case, the substrate separation step is omitted. Since the substrate A10 remains in the light-emitting device, the light-emitting device has voids X1. Light emitted from the light-emitting layer 150 is reflected or scattered at the voids X1. The reflection or scattering of light is caused by the difference in refractive index between the semiconductor layer and air in the voids X1. The reflection or scattering of light improves the light extraction efficiency of the light-emitting device.

4-3. Protective Layer

Example 1-3

Figure 12:
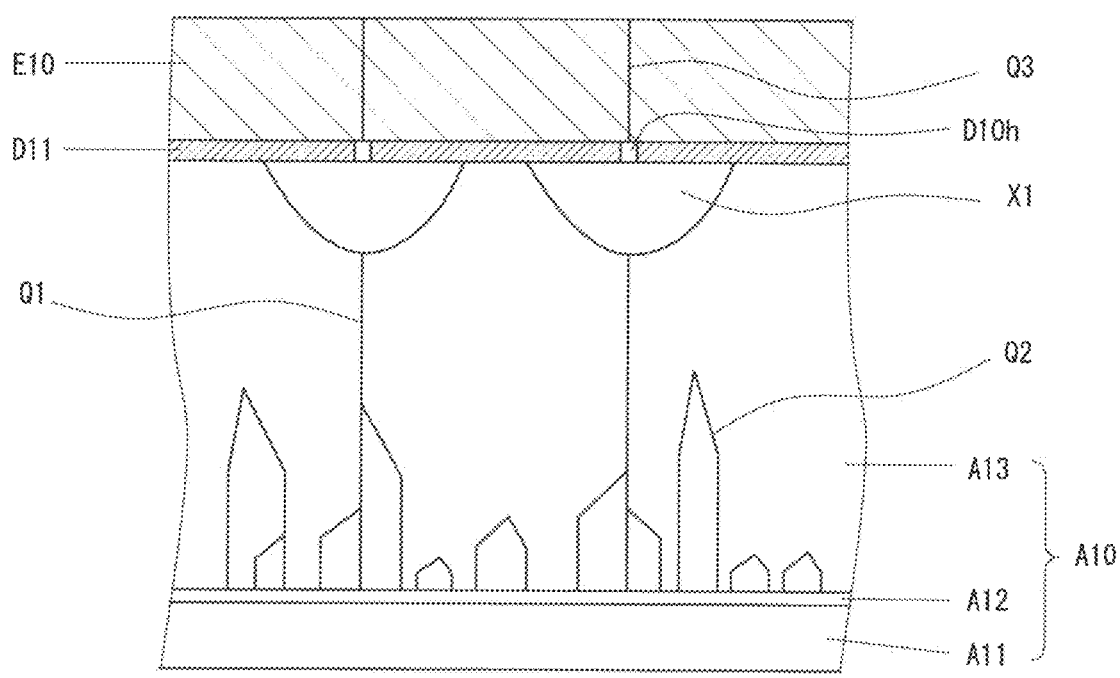
FIG. 12 illustrates a production method for a semiconductor device according to a modification of the first embodiment (part 2)

As shown in FIG. 12, the protective layer B10 in FIG. 11 is not formed. In such a case, the GaN layer A13 of the substrate A10 also serves as the decomposition layer. The GaN layer A13 is relatively more decomposed because the protective layer B10 does not exist. The bridging portion formation step involves formation of a flat bridging portion D11 on the GaN layer A13 serving as the decomposition layer. The semiconductor layer E10 is readily separated from the substrate A10. However, this case is not suitable for the reuse of the substrate A10, since the surface of the GaN layer A13 of the substrate A10 is hollowed.

4-4. Material of Bridging Portion

In the above embodiment, the bridging portion D10 is composed of an AlGaN layer formed at a high temperature. The thermal decomposition temperature of the bridging portion D10 is higher than that of the decomposition layer C10. The bridging portion D10 may be composed of an AlGaN layer formed at a low temperature. The bridging portion D10 may be composed of an AlN layer or an AlGaInN layer. The bridging portion D10 preferably contains an Al-containing Group III nitride semiconductor. The bridging portion D10 may be formed of GaN or InGaN, which depends on the material for the decomposition layer C10.

4-5. Bridging Portion Having Multilayer Structure

In the above embodiment, the bridging portion D10 is formed of a single layer. The bridging portion D10 may have a multilayer structure. Alternatively, the bridging portion D10 may have a superlattice structure; for example, a superlattice structure formed of an AlGaN layer and a GaN layer. Preferably, the entire bridging portion D10 does not have an excessively large thickness.

4-6. Material of Decomposition Layer

In the above embodiment, the material of the decomposition layer C10 is InGaN in the Examples 1-1 and 1-2, and GaN in the Example 1-3. The decomposition layer C10 may be doped with Si or Mg. Needless to say, the decomposition layer C10 preferably has a low thermal decomposition temperature. Hence, the decomposition layer C10 preferably contains In. The incorporation of Al tends to increase the thermal decomposition temperature. In the case where the decomposition layer C10 contains Al, it is necessary that the Al composition ratio of the decomposition layer C10 is smaller than those of the bridging portion D10 and the protective layer B10. The decomposition layer C10 may be formed of single crystal BN or a material other than a Group III nitride (e.g., single crystal TiN or SiNx), so long as the decomposition layer C10 has a thermal decomposition temperature lower than that of the bridging portion D10 and has as same crystal structure as the Group III nitride, i.e., hexagonal. The decomposition layer C10 is preferably formed of a Group III nitride semiconductor having a composition similar to that of the semiconductor layer formed later. The use of such a Group III nitride semiconductor can prevent the intrusion of impurities into the later-formed semiconductor layer. Thus, the decomposition layer C10 is preferably formed of GaN or InGaN.

4-7. Template Substrate

The substrate A10 includes the sapphire substrate A11. The substrate A10 may be formed of a material other than sapphire; for example, SiC, Si, ZnO, GaN, AlN, $MgAl_2O_4$, or $Ga_2O_3$. The sapphire substrate A11 may have an uneven surface. The GaN layer A13 may be replaced with an InGaN layer, an AlGaN layer, an AlInGaN layer, or an AlN layer. The GaN layer A13 may be doped with, for example, Si.

4-8. Decomposition Step (Etching Step)

The decomposition step involves supply of a gas mixture of $H_2$ gas and at least one of $N_2$ and $NH_3$ gas. However, $H_2$ gas is not necessarily supplied. In such a case, the decomposition layer C10 is not etched by $H_2$ gas, but is only thermally decomposed. In such a case, the decomposition layer C10 can be removed if the bridging portion D10 has a sufficiently small thickness. However, $H_2$ gas is preferably mixed in $N_2$ gas or $NH_3$ gas for etching. In that case, the ratio (by volume) of the total amount of $N_2$ and $NH_3$ to the total amount of all the gases is preferably 0.1% to 10%, more preferably 0.1% to 5.0%, still more preferably 0.1% to 2.5%.

4-9. Intermediate Layer

In the above embodiment, the semiconductor layer E10 is formed on the bridging portion D10. The semiconductor layer E10 corresponds to the GaN substrate 110. The semiconductor layer E10 may be an intermediate layer; i.e., the GaN substrate 110 may be formed on the semiconductor layer E10. In such a case, the polishing step involves polishing of the intermediate layer together with the bridging portion D10.

4-10. Combination

The above-described modifications may be used in any combination.

5. Summary of First Embodiment

As described above in detail, the semiconductor device production method of the first embodiment involves provision of the voids X1, each being defined by the bridging portion D10 and the non-decomposed (remaining) portion of the decomposition layer C10. Specifically, the threading dislocations Q1 exposed to the surface of the bridging portion D10 is etched to be wider, to thereby provide the through holes D10h. Subsequently, the decomposition layer C10 exposed through the through holes D10h is decomposed. Particles generated through decomposition of the decomposition layer C10 are discharged via the through holes D10h, to thereby provide the voids X1. The presence of the voids X1 facilitates the separation of the semiconductor device from the growth substrate. The thus-produced semiconductor device does not include a heterogeneous substrate having a lattice constant considerably different from that of the semiconductor layer. Thus, a stress is sufficiently relaxed in the semiconductor device.

Second Embodiment

The second embodiment will now be described.

1. Production Method for Semiconductor Device

Example 2-1

The present example is characterized in that a pit layer having V-shaped pits is formed under the decomposition layer.

1-1. Step of Providing Substrate

A substrate A10 is provided as shown in FIG. 3.

1-2. Step of Forming Pit Layer

Figure 13:
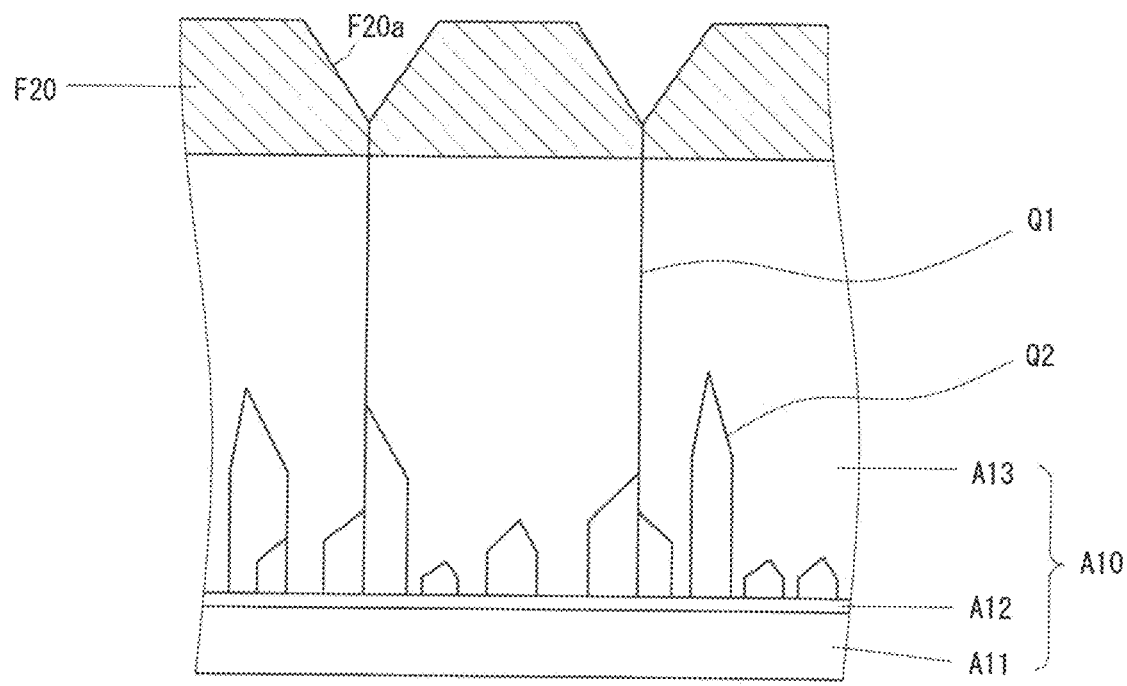
FIG. 13 illustrates a production method for a semiconductor device of a second embodiment (part 1)

Subsequently, a pit layer F20 is formed on the GaN layer A13 as shown in FIG. 13. The pit layer F20 is a GaN layer having V-shaped pits F20a. The substrate temperature is adjusted to 750° C. to 950° C. for formation of the pit layer F20. A low substrate temperature causes widening of the pits F20a from the top of the dislocation Q1. An increase in the thickness of the pit layer F20 also causes widening of the pits F20a. Thus, the pits F20a having a desired V-shape can be formed by appropriately determining the substrate temperature and the thickness of the pit layer F20. The pits F20a are widened from threading dislocations Q1. Thus, the threading dislocations Q1 are exposed through the bottoms of the pits F20a in the pit layer F20.

1-3. Step of Forming Protective Layer

Figure 14:
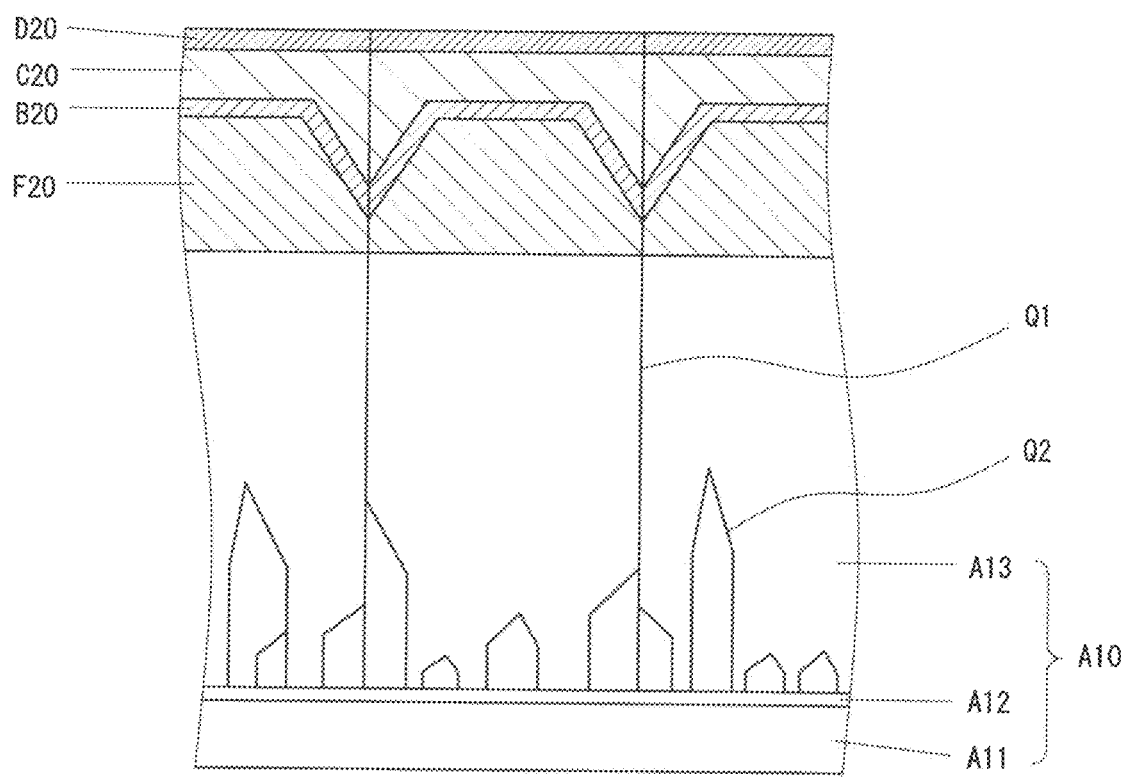
FIG. 14 illustrates the production method for the semiconductor device of the second embodiment (part 2)

Subsequently, a protective layer B20 with a uniform thickness is formed along the surface of the pits F20a on the pit layer F20 as shown in FIG. 14. The protective layer B20 has an uneven shape corresponding to the shape of the pits F20a of the pit layer F20. The threading dislocations Q1 extend through the protective layer B20. The protective layer B20 is, for example, an AlGaN layer. The thermal decomposition temperature of the AlGaN layer is sufficiently higher than that of the below-described decomposition layer C20.

1-4. Step of Forming Decomposition Layer

Subsequently, a decomposition layer C20 is formed on the protective layer B20 as shown in FIG. 14. The decomposition layer C20 has a flat surface. At this time, the decomposition layer C20 is formed so as to fill in the V-shaped pits so that the top surface of the decomposition layer C20 is flat. The threading dislocations Q1 extend through the decomposition layer C20. The decomposition layer C20 is formed of InGaN. The InGaN is thermally decomposed at a relatively low temperature. The thus-formed decomposition layer C20 is partially removed through a decomposition step described below.

1-5. Step of Forming Bridging Portion

Subsequently, a bridging portion D20 with a uniform thickness is formed on a flat top surface of the decomposition layer C20 as shown in FIG. 14. The bridging portion D20 has a flat surface. The threading dislocations Q1 extend through the bridging portion D20. The threading dislocations Q1 are then exposed to the surface of the bridging portion D20. The bridging portion D20 is formed of AlGaN.

1-6. Decomposition Step

Figure 15:
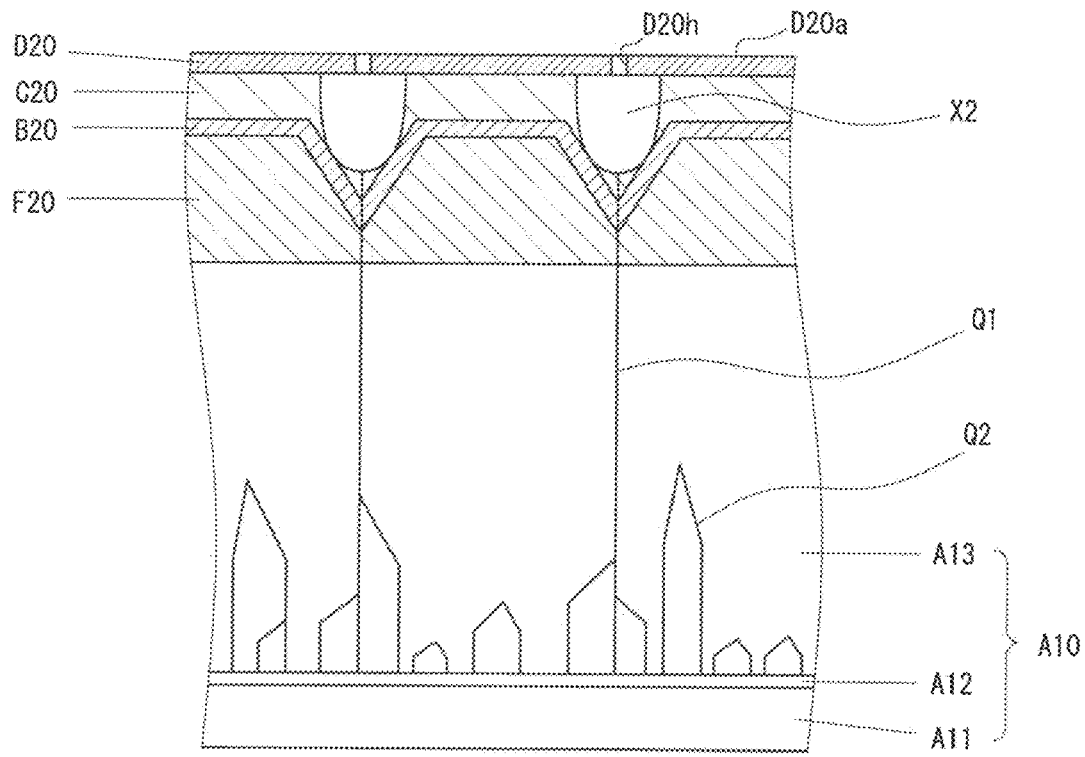
FIG. 15 illustrates the production method for the semiconductor device of the second embodiment (part 3)

Subsequently, the decomposition layer C20 is decomposed as shown in FIG. 15. A gas mixture containing $H_2$ gas and at least one of $N_2$ gas and $NH_3$ gas is supplied for the decomposition. The substrate temperature is adjusted to a temperature equal to or higher than the thermal decomposition temperature of the decomposition layer C20 and lower than the thermal decomposition temperature of the bridging portion D20. The threading dislocations Q1 are lattice defects due to breakage of interatomic bonds. Accordingly, the decomposition of the semiconductor is likely to occur from the threading dislocations Q1. Thus, even if the semiconductor material has high thermal decomposition temperature, the decomposition of the semiconductor occurs from the threading dislocations Q1. Therefore, the surface of the bridging portion D20 is etched from the threading dislocations Q1. Consequently, through holes D20h are provided in the bridging portion D20. The gas mixture widens the threading dislocations Q1 exposed to the surface of the bridging portion D20, to thereby provide the through holes D20h. Thus, the decomposition layer C20 is exposed through the through holes D20h.

As shown in FIG. 15, the gas mixture decomposes a portion of the decomposition layer C20 exposed through the through holes D20h. The decomposition layer C20 is thermally decomposed and etched by means of $H_2$ gas. Decomposition products generated through decomposition of the decomposition layer C20 are discharged via the through holes D20h to the outside of the bridging portion D20.

Figure 16:
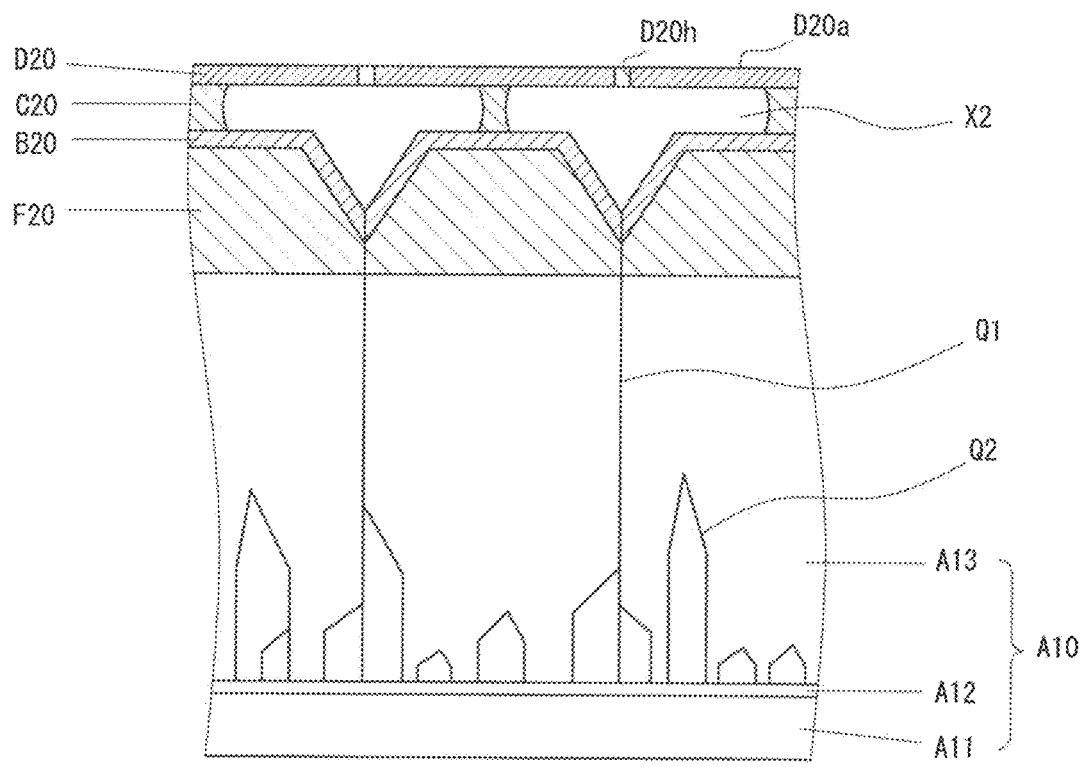
FIG. 16 illustrates the production method for the semiconductor device of the second embodiment (part 4)

As shown in FIG. 16, the decomposition layer C20 is further etched. Since the bridging portion D20 is not thermally decomposed, the bridging portion D20, which has the through holes D20h, remains after the etching. Thus, voids X2 are provided in the decomposition layer C20 beneath the through holes D20h and above the V-shaped area of the protective layer B20. Each of the voids X2 is defined by the non-decomposed (remaining) portion of the decomposition layer C20 and the bridging portion D20. In this stage, a connection portion between the decomposition layer C20 and the bridging portion D20 has a sufficiently small width.

$H_2$ gas contained in the gas mixture generally etches the decomposition layer C20. Thus, the partial pressure of $H_2$ gas is preferably increased. However, the supply of $H_2$ gas alone may cause leaching of Ga metal in the form of droplets. Therefore, at least one of $N_2$ gas and $NH_3$ gas is preferably supplied in addition to $H_2$ gas. More preferably, a gas mixture of $H_2$ and $NH_3$ is supplied. The ratio (by volume) of the total amount of $N_2$ and $NH_3$ to the total amount of all the gases is preferably 0.1% to 10%, more preferably 0.1% to 5.0%, still more preferably 0.1% to 2.5%.

1-7. Step of Forming Semiconductor Layer

Figure 17:
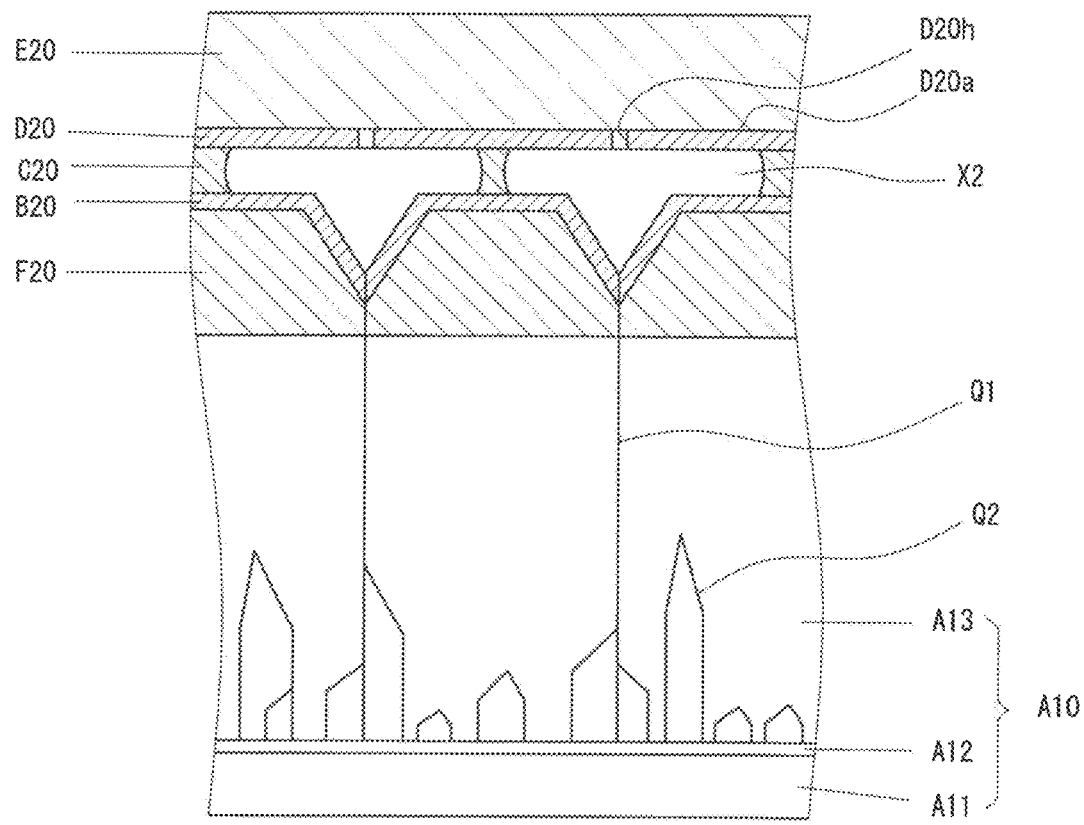
FIG. 17 illustrates the production method for the semiconductor device of the second embodiment (part 5)

Subsequently, a semiconductor layer E20 is grown on the bridging portion D20 as shown in FIG. 17. The semiconductor layer E20 is grown from the top surface D20a of the bridging portion D20. Thus, the semiconductor layer E20 appropriately fills the through holes D20h of the bridging portion D20; i.e., the through holes D20h provided in the bridging portion D20 are blocked. In some cases, new threading dislocations Q3 may generate from the through holes D20h of the bridging portion D20. Alternatively, no threading dislocations may generate from the through holes D20h of the bridging portion D20.

The semiconductor layer E20 corresponds to the GaN substrate 110 shown in FIG. 1. Thus, the semiconductor layer E20 is formed of GaN. Thereafter, on the semiconductor layer E20 are formed an n-type contact layer 120, an n-side electrostatic breakdown preventing layer 130, an n-side superlattice layer 140, a light-emitting layer 150, a p-side cladding layer 160, and a p-type contact layer 170.

1-8. Step of Forming Electrode

Subsequently, a transparent electrode TE1 is formed on a portion of the p-type contact layer 170. A dent is then formed in the remaining portion (i.e., a portion on which the transparent electrode TE1 is not formed) of the p-type contact layer 170. The n-type contact layer 120 is exposed through the bottom of the dent. An n-electrode N1 is then formed on the n-type contact layer 120. A p-electrode P1 is formed on the transparent electrode TE1.

1-9. Step of Separating Substrate

The bridging portion D20 is in slight contact with the decomposition layer C20. Thus, the bridging portion D20 is readily separated from the decomposition layer C20. The bridging portion D20 can be manually separated from the decomposition layer C20 by the operator.

1-10. Polishing Step

In this stage, the bridging portion D20 remains on the bottom of the GaN substrate 110 of the light-emitting device 100. Thus, the bridging portion D20 is removed through polishing. The light-emitting device 100 is thereby produced.

2. Modifications 2-1. Formation of Decomposition Layer Having Small Thickness

Example 2-2

Figure 18:
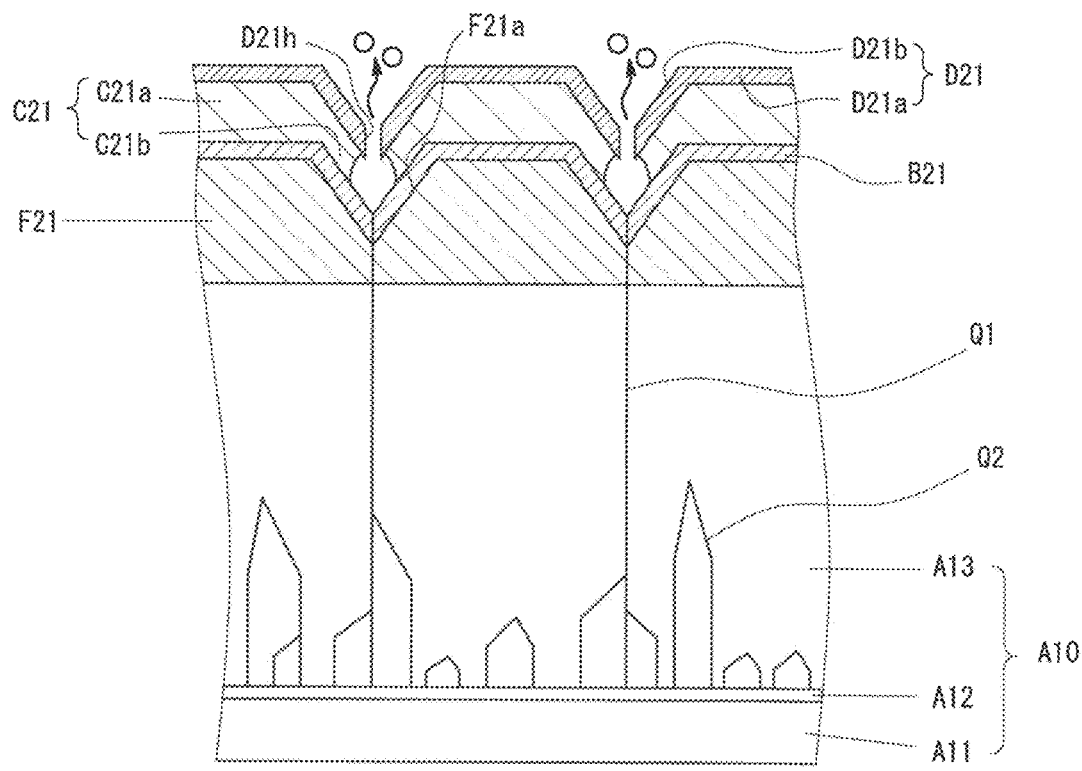
FIG. 18 illustrates a production method for a semiconductor device according to a modification of the second embodiment (part 1)

In the present example, the decomposition layer is formed along the V-shaped pits. Therefore, the V-shaped pits remain in the decomposition layer. FIG. 18 illustrates the case of formation of a decomposition layer having a small thickness. As shown in FIG. 18, in the case where a decomposition layer C21 has a small thickness, the decomposition layer C21 and a bridging portion D21 have a shape corresponding to that of pits F21a. The decomposition layer C21 has flat portions C21a and slope portions C21b. The bridging portion D21 has flat portions D21a and slope portions D21b. Threading dislocations Q1 are exposed through the bottoms of the slope portions C21b.

This production method includes a step of forming a pit layer F21 having V-shaped pits F21a, and a step of forming, on the pit layer F21, a protective layer B21 having a shape corresponding to that of the pits F21a. That is, the protective layer B21 is formed along the surface of the pit layer F21 without filling in the pits F21a. The decomposition layer formation step involves formation, on the protective layer B21, of a decomposition layer C21 having a shape corresponding to that of the protective layer B21. That is, the decomposition layer C21 is formed without filling in the pits F21a. The bridging portion formation step involves formation, on the decomposition layer C21, of a bridging portion D21 having a shape corresponding to that of the decomposition layer C21. That is, the bridging portion D21 is formed along the surface of the decomposition layer C21 without filling in the pits F21a.

In the decomposition step, decomposition starts from the threading dislocations Q1 of the bridging portion D21. The protective layer B21 is not decomposed. Thus, the decomposition layer C21 is decomposed in a region between the protective layer B21 and the bridging portion D21, to thereby provide voids between the protective layer B21 and the bridging portion D21. The bridging portion D21 is supported by a non-decomposed (slightly remaining) portion of the decomposition layer C21.

Thus, the substrate can be readily separated from a semiconductor layer to be grown subsequently. The voids can be utilized for production of a light-emitting device.

2-2. Formation of Pit Above Protective Layer

Example 2-3

Figure 19:
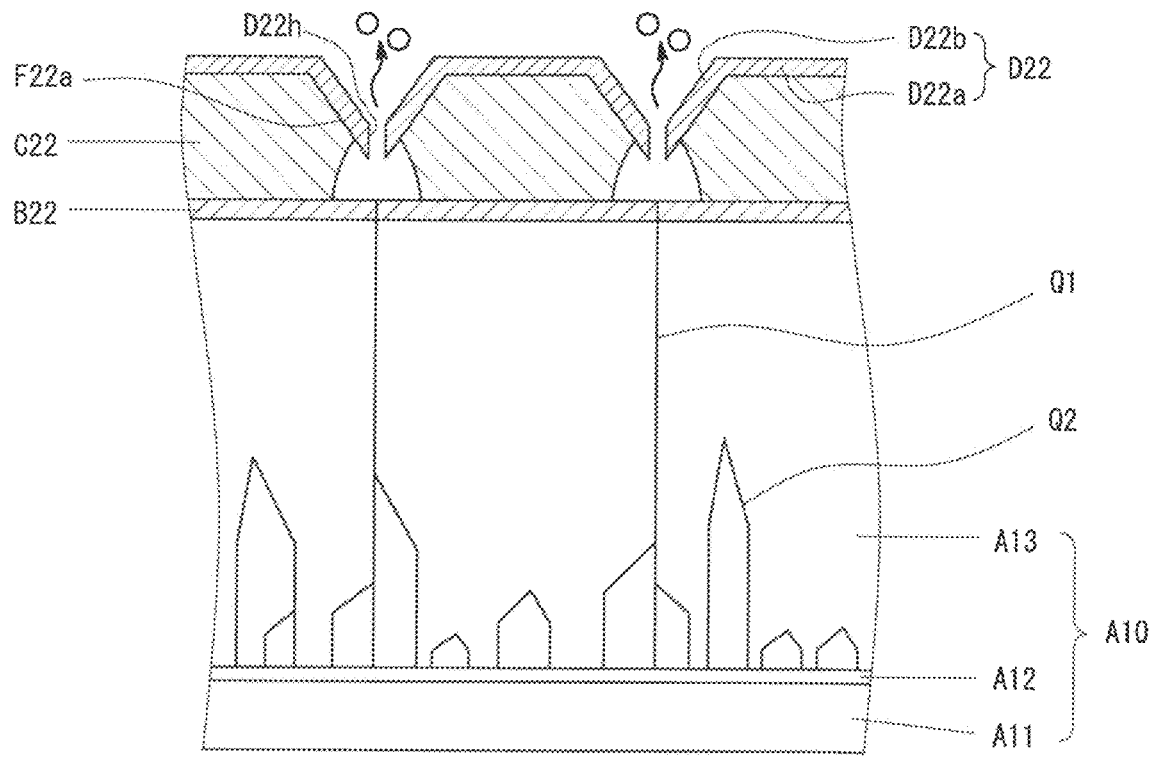
FIG. 19 illustrates a production method for a semiconductor device according to a modification of the second embodiment (part 2)

In the present embodiment, the decomposition layer is also used as the pit layer. That is, there is no pit layer F21 in FIG. 18, and pits are formed on the decomposition layer. FIG. 19 illustrates the case of formation of pits above a protective layer. In this case, firstly, a flat protective layer B22 is formed. A decomposition layer C22 which is also pit layer is then formed. V-shaped pits F22a are formed on the decomposition layer C22. A bridging portion D22 is formed in a uniform thickness along the top surface of the decomposition layer C22 without filling in the pits F22a. The bridging portion D22 has flat portions D22a and slope portions D22b at the pits F22a. Threading dislocations Q1 are exposed through the bottoms of the slope portions D22b.

This product method includes a step of forming the flat protective layer B22. The decomposition layer formation step involves formation of the decomposition layer C22 having the pits F22a on the protective layer B22. The bridging portion formation step involves formation, on the decomposition layer C22, of the bridging portion D22 having a shape corresponding to a surface shape of the decomposition layer C22.

In the decomposition step, decomposition starts from the threading dislocations Q1 of the top surface of the bridging portion D22. The protective layer B22 is not decomposed. Thus, the decomposition layer C22 is decomposed in a region beneath the V-shaped pits F22a between the flat protective layer B22 and the slope portions D22b of the bridging portion D22, to thereby provide voids between the protective layer B22 and the bridging portion D22. The bridging portion D22 is supported by a non-decomposed (slightly remaining) portion of the decomposition layer C22.

Thus, the substrate can be readily separated from a semiconductor layer to be grown subsequently. On the contrary, the voids can be utilized for production of a light-emitting device without separating the substrate.

2-3. Formation of Pit Without Formation of Protective Layer

Example 2-4

Figure 20:
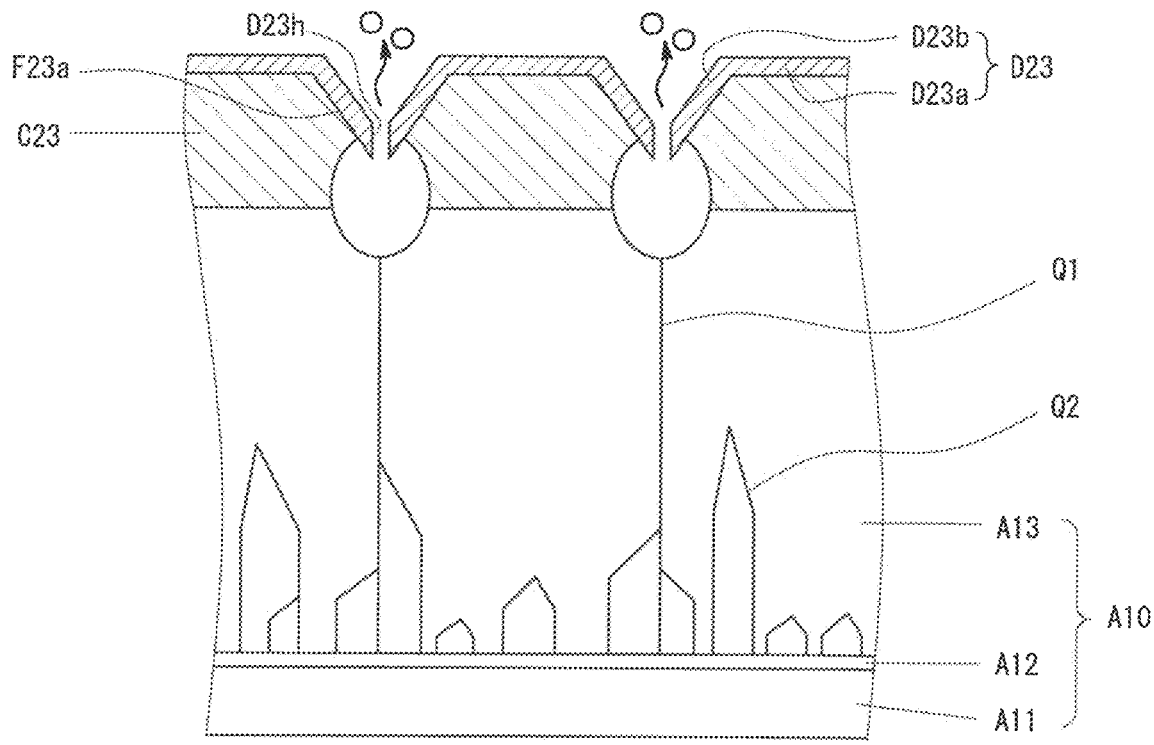
FIG. 20 illustrates a production method for a semiconductor device according to a modification of the second embodiment (part 3)

In the present example, a protective layer is not formed. FIG. 20 illustrates the case of formation of pits without formation of a protective layer. In this case, firstly, a decomposition layer C23 having pits F23a is formed on the substrate A10 shown in FIG. 3. The decomposition layer C23 is grown so as to form the V-shaped pits F23a on the surface thereof. A bridging portion D23 is then formed so as to have a certain thickness without filling in the pits F23a on the decomposition layer C23. The bridging portion D23 has flat portions D23a and slope portions D23b. Threading dislocations Q1 are exposed through the bottoms of the slope portions D23b.

In this production method, the decomposition layer formation step involves formation of the decomposition layer C23 having the pits F23a. The bridging portion formation step involves formation, on the decomposition layer C23, of the bridging portion D23 having a shape corresponding to the pits of the decomposition layer C23.

In the decomposition step, decomposition starts from the threading dislocations Q1 of the top surface of the bridging portion D23, and the decomposition layer C23 is decomposed around the threading dislocations Q1. Since no protective layer is formed, the area around the threading dislocations Q1 in the GaN layer A13 is decomposed. The bridging portion D23 is supported by a non-decomposed portion of the decomposition layer C23, which slightly remains at a position away from the threading dislocations Q1.

Thus, the substrate can be readily separated from a semiconductor layer to be grown subsequently. On the contrary, when the substrate is not separated, the voids can be utilized for production of a light-emitting device.

2-4. Material of Pit Layer

The pit layers F20 and F21 may be formed of AlGaN, InGaN, or AlInGaN instead of GaN. The pit layers F20 and F21 may be doped with, for example, Si.

2-5. Combination

The second embodiment and modifications thereof may be used in combination with the first embodiment and modifications thereof.

3. Summary of Second Embodiment

As described above in detail, the semiconductor device production method of the second embodiment involves formation of the protective layers B20 and B21 after formation of the pit layers F20 and F21, respectively. The protective layers B20 and B21 have a shape corresponding to a surface shape of the pit layers F20 and F21. The decomposition layers C20 and C21 and the bridging portions D20 and D21 are formed on the protective layers B20 and B21, respectively. A portion of the decomposition layers C20 and C21 between the protective layer B20 and B21 and the bridging portions D20 and D21, respectively is then decomposed, to thereby provide voids. The presence of the voids facilitates the separation of the semiconductor device from the growth substrate. The thus-produced semiconductor device does not include a heterogeneous substrate having a lattice constant considerably different from that of the semiconductor layer. Thus, a stress is sufficiently relaxed in the semiconductor device.

Third Embodiment

The third embodiment will now be described.

1. Production Method for Semiconductor Device

Example 3-1

In the present example, dents are formed in a periodic manner instead of V-shaped pits shown in FIG. 19 on the surface of the decomposition layer.

1-1. Step of Providing Substrate

A substrate A10 is provided as shown in FIG. 3.

1-2. Step of Forming Protective Layer

Subsequently, a protective layer B30 is formed on the GaN layer A13 (see FIG. 21) in a uniform thickness. The top surface of the protective layer B30 is flat. Threading dislocations Q1 extend through the protective layer B30. The protective layer B30 is, for example, an AlGaN layer. The thermal decomposition temperature of the AlGaN layer is sufficiently higher than that of the below-described decomposition layer C30.

1-3. Step of Forming Decomposition Layer

Figure 21:
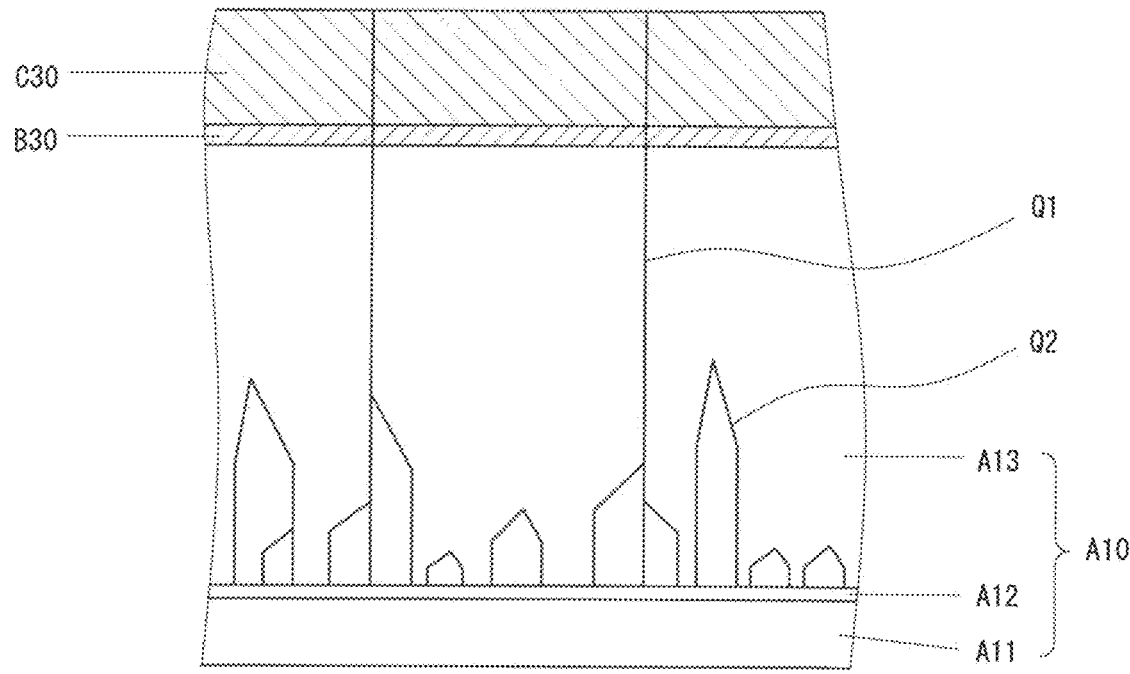
FIG. 21 illustrates a production method for a semiconductor device of a third embodiment (part 1)

Subsequently, a decomposition layer C30 is formed on the protective layer B30 as shown in FIG. 21. The top surface of the decomposition layer C30 is flat. The threading dislocations Q1 extend through the decomposition layer C30. The decomposition layer C30 is formed of InGaN. The InGaN is thermally decomposed at a relatively low temperature. The thus-formed decomposition layer C30 is partially removed through a decomposition step described below.

1-4. Step of Forming Dent

Figure 22:
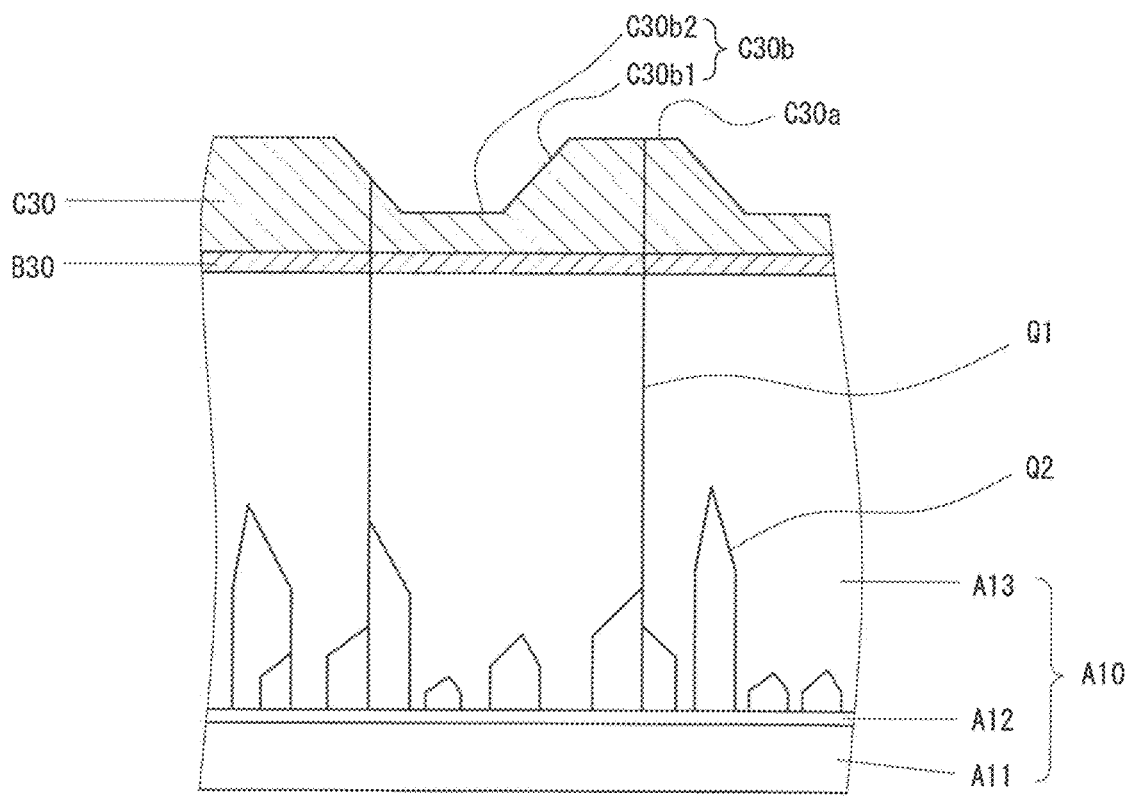
FIG. 22 illustrates the production method for the semiconductor device of the third embodiment (part 2)

Subsequently, dents C30$b$ are formed in the decomposition layer C30 as shown in FIG. 22. The dents C30$b$ are preferably formed in a periodic manner. For example, the dents C30$b$ are arranged at the lattice points of triangular lattice, which is continuously disposed in a honeycomb structure. As shown in FIG. 22, flat portions C30$a$ and the dents C30$b$ are exposed on the surface of the decomposition layer C30. Specifically, the dents C30$b$, each having a side portion C30$b$1 and a bottom portion C30$b$2, are formed in the decomposition layer C30, and the protective layer B30 is not exposed through the bottom portions C30$b$2. A groove (dents) is formed in a ring shape in the periphery of the substrate A10 (wafer) until the protective layer B30 is exposed. The dents C30$b$ may be formed by a photolithographic technique. Alternatively, the dents C30$b$ may be formed by means of decomposition by laser.

1-5. Step of Forming Bridging Portion

Figure 23:
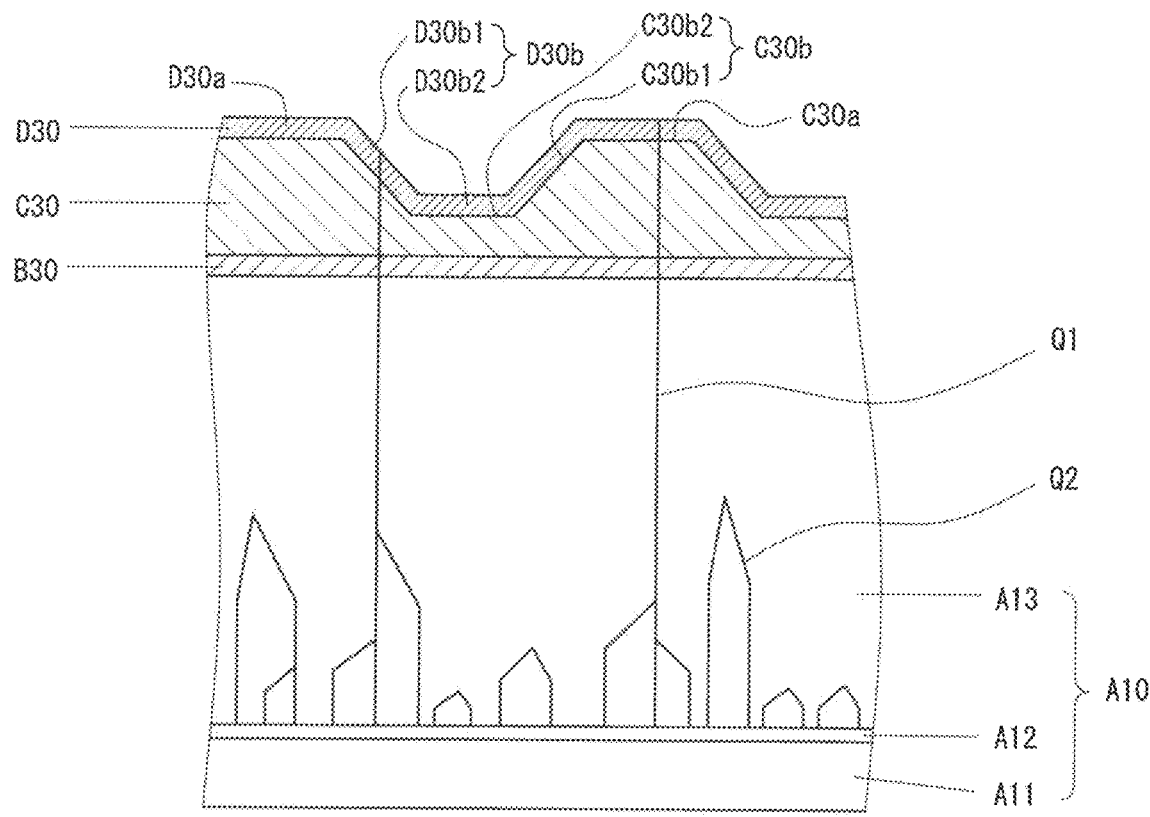
FIG. 23 illustrates the production method for the semiconductor device of the third embodiment (part 3)

Subsequently, a bridging portion D30 is formed on the decomposition layer C30 with a uniform thickness as shown in FIG. 23. The bridging portion D30 has flat portions D30$a$ and dents D30$b$. Thus, the bridging portion D30 has a shape corresponding to the dents C30$b$ of the decomposition layer C30. Each of the dents D30$b$ has a side portion D30$b$1 and a bottom portion D30$b$2. The side portions D30$b$1 of the bridging portion D30 are formed on the side portions C30$b$1 of the dents C30$b$ on the decomposition layer C30. The bottom portions D30$b$2 of the bridging portion D30 are formed on the bottom portions C30$b$2 of the dents C30$b$ on the decomposition layer C30. The threading dislocations Q1 extend through the bridging portion D30 and are exposed to the surface of the bridging portion D30. The bridging portion D30 is formed of AlGaN.

1-6. Decomposition Step

Figure 24:
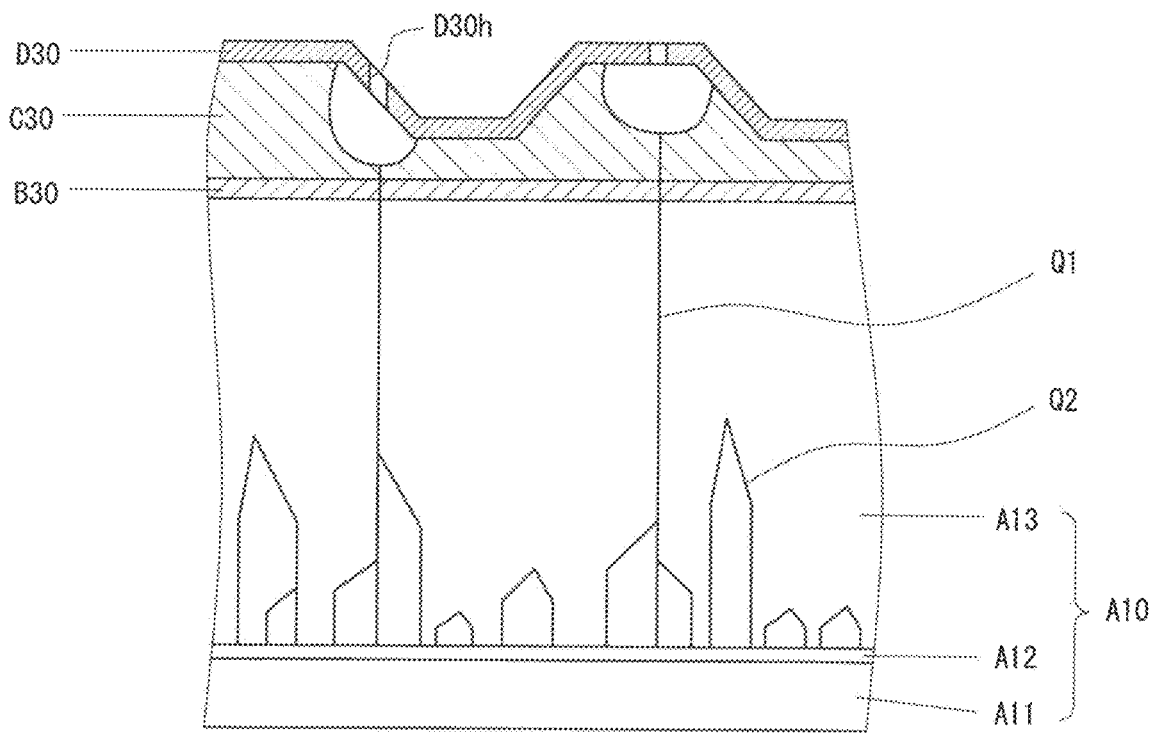
FIG. 24 illustrates the production method for the semiconductor device of the third embodiment (part 4)

Subsequently, the decomposition layer C30 is decomposed as shown in FIG. 24. A gas mixture containing $H_2$ gas and at least one of $N_2$ gas and $NH_3$ gas is supplied for the decomposition. The substrate temperature is adjusted to a temperature equal to or higher than the thermal decomposition temperature of the decomposition layer C30 and lower than the thermal decomposition temperatures of the bridging portion D30 and the protective layer B30. The threading dislocations Q1 are lattice defects due to breakage of interatomic bonds. Accordingly, the decomposition of the semiconductor is likely to occur from the threading dislocations Q1. Thus, even if the semiconductor material of the bridging portion D30 has high thermal decomposition temperature, the decomposition of the semiconductor occurs from the threading dislocations Q1. Therefore, the surface of the bridging portion D30 is etched from the threading dislocations Q1. The gas mixture widens the threading dislocations Q1 exposed to the surface of the bridging portion D30, to thereby provide the through holes D30$h$. Thus, the decomposition layer C30 is exposed through the through holes D30$h$.

As shown in FIG. 24, the gas mixture decomposes a portion of the decomposition layer C30 exposed through the through holes D30$h$. The decomposition layer C30 is thermally decomposed and etched by means of $H_2$ gas. Decomposition products generated through decomposition of the decomposition layer C30 are discharged via the through holes D30$h$ to the outside of the bridging portion D30.

Figure 25:
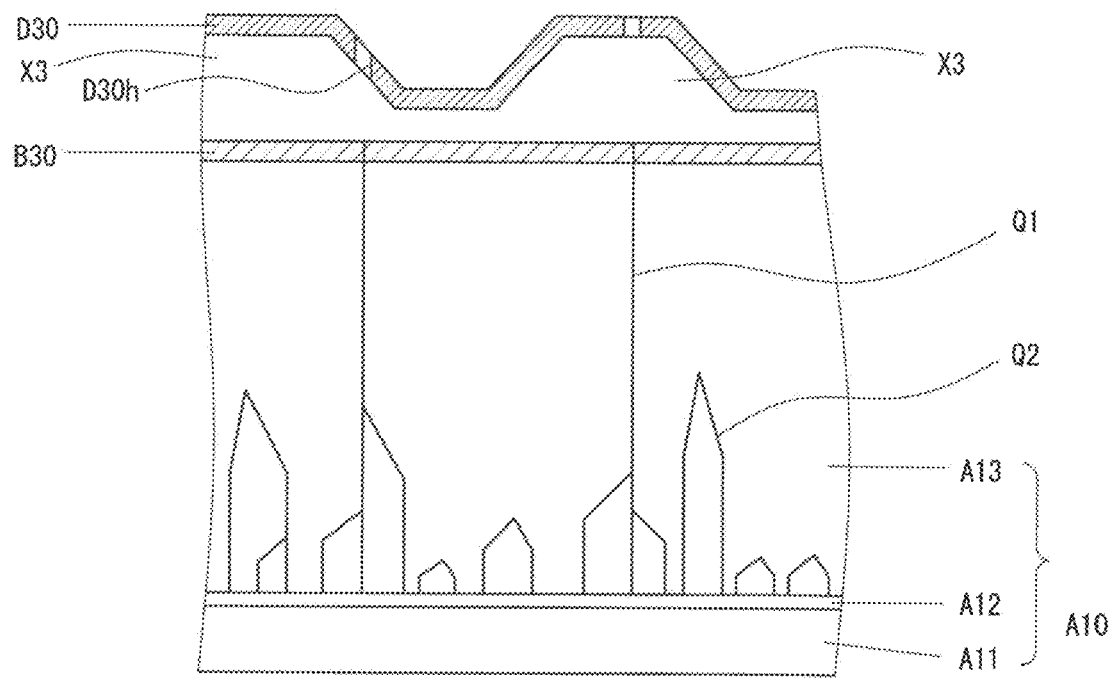
FIG. 25 illustrates the production method for the semiconductor device of the third embodiment (part 5)

As shown in FIG. 25, the decomposition layer C30 is further etched. Since the bridging portion D30 is not thermally decomposed, the bridging portion D30, which has the through holes D30$h$, remains after the etching. The decomposition layer C30 is almost completely decomposed between the protective layer B30 and the bridging portion D30. In this case, a continuous void X3 is provided in an entire area between the protective layer B30 and the bridging portion D30. However, since the periphery of the bridging portion D30 is bonded to the protective layer B30, the bridging portion D30 is not separated from the substrate A10.

$H_2$ gas contained in the gas mixture generally etches the decomposition layer C30. Thus, the partial pressure of $H_2$ gas is preferably increased. However, the supply of $H_2$ gas alone may cause leaching of Ga metal in the form of droplets. Therefore, at least one of $N_2$ gas and $NH_3$ gas is preferably supplied in addition to $H_2$ gas.

1-7. Step of Forming Semiconductor Layer

Figure 26:
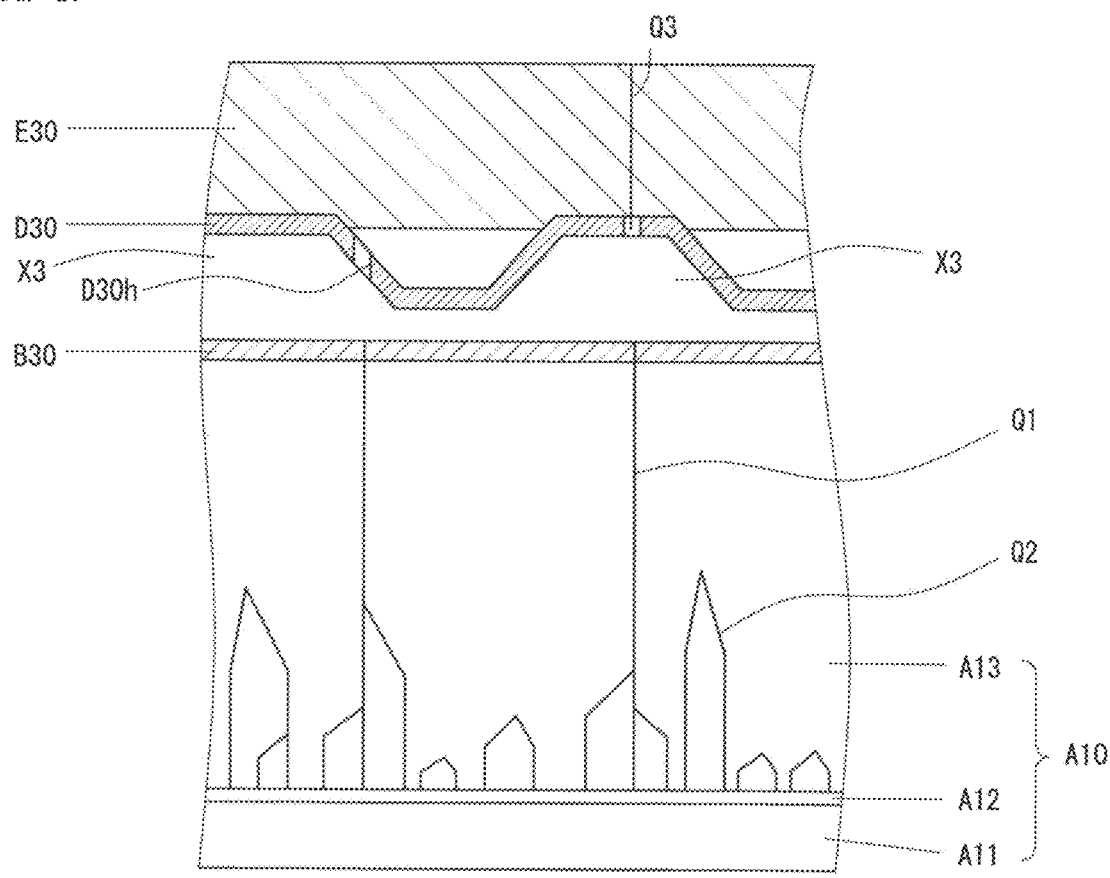
FIG. 26 illustrates the production method for the semiconductor device of the third embodiment (part 6)

Subsequently, a semiconductor layer E30 is grown on the bridging portion D30 as shown in FIG. 26. The semiconductor layer E30 is grown from the flat portions D30$a$ of the bridging portion D30. Thus, the semiconductor layer E30 appropriately fills at least a portion of the through holes D30$h$ of the bridging portion D30; i.e., at least a portion of the through holes D30$h$ provided in the bridging portion D30 is blocked. In some cases, new threading dislocations Q3 may generate from the through holes D30$h$ of the bridging portion D30. Alternatively, no threading dislocations may generate from the through holes D30$h$ of the bridging portion D30.

The semiconductor layer E30 corresponds to the GaN substrate 110 shown in FIG. 1. Thus, the semiconductor layer E30 is formed of GaN. Thereafter, on the semiconductor layer E30 are formed an n-type contact layer 120, an n-side electrostatic breakdown preventing layer 130, an n-side superlattice layer 140, a light-emitting layer 150, a p-side cladding layer 160, and a p-type contact layer 170.

1-8. Step of Forming Electrode

Subsequently, a transparent electrode TE1 is formed on a portion of the p-type contact layer 170. A dent is then formed in the remaining portion (i.e., a portion on which the transparent electrode TE1 is not formed) of the p-type contact layer 170. The n-type contact layer 120 is exposed through the bottom of the dent. An n-electrode N1 is then formed on the n-type contact layer 120. A p-electrode P1 is formed on the transparent electrode TE1.

1-9. Step of Separating Substrate

The bridging portion D30 is almost completely separated from the decomposition layer C30. The bridging portion D30 can be manually separated from the decomposition layer C30 by the operator.

1-10. Polishing Step

In this stage, the bridging portion D30 remains on the bottom of the GaN substrate 110 of the light-emitting device 100. Thus, the bridging portion D30 is removed through polishing. The light-emitting device 100 is thereby produced.

2. Modifications 2-1. Formation of Dent Through Which Protective Layer is Exposed

Example 3-2

Figure 27:
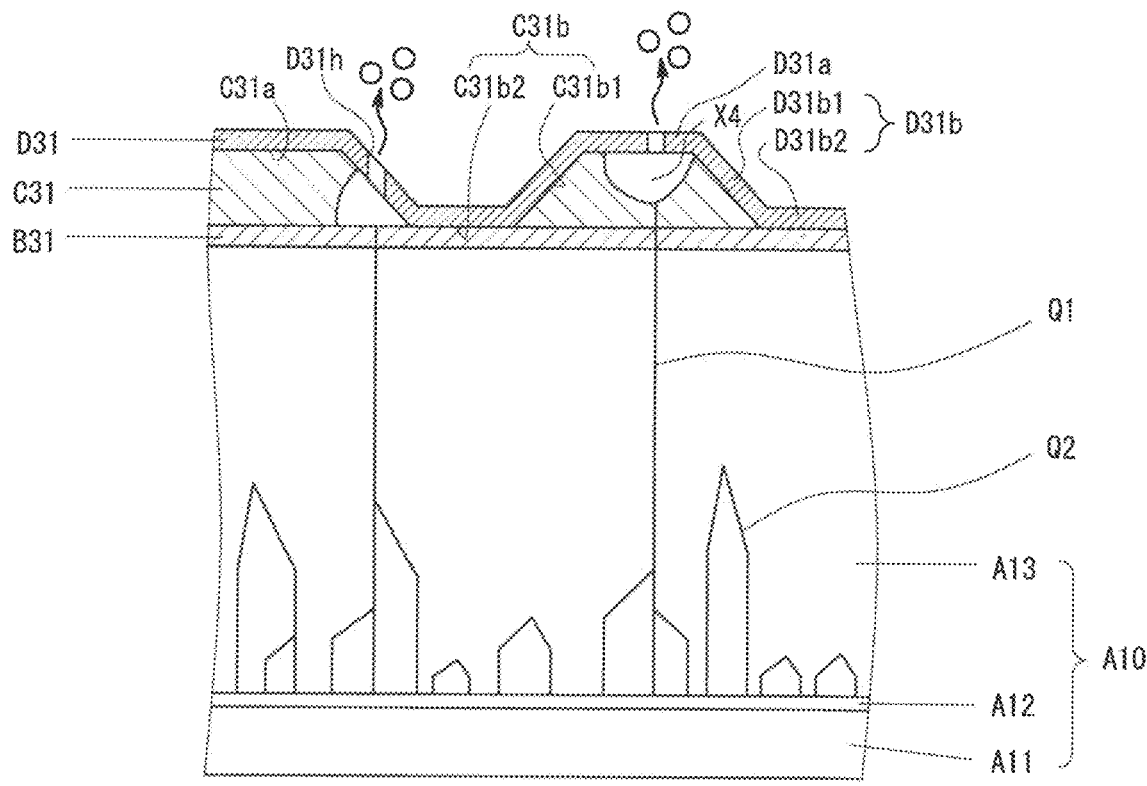
FIG. 27 illustrates a production method for a semiconductor device according to a modification of the third embodiment (part 1)

In the present example, dents C30*b* being formed on the decomposition layer C30 shown in FIG. 22 have a depth to expose the protective layer B30. FIG. 27 illustrates the case of formation of dents C31*b* through which a protective layer B31 is exposed. The dents C31*b* are arranged at the triangular lattice points as same as Example 3-1. The bridging portion D31 is formed in a uniform thickness along the surface of the decomposition layer C31 having the dents C31*b*. The bridging portion D31 has flat portions D31*a* and dents D31*b*. Each dent D31*b* has a side portion D31*b*1 and a bottom portion D31*b*2. The bottom portion D31*b*2 of the bridging portion D31 is in contact with the protective layer B31. Thus, the bridging portion D31 is appropriately supported by the protective layer B31.

This production method includes a step of forming the flat protective layer B31. The decomposition layer formation step involves formation of the decomposition layer C31 on the protective layer B31. The dent formation step involves formation, in the decomposition layer C31, of the dents C31*b* each having a side portion C31*b*1 and a bottom portion C31*b*2, so that the protective layer B31 is exposed through the bottom portions C31*b*2. The bridging portion formation step involves formation of a bridging portion D31 having a shape corresponding to that of the dents C31*b*.

In the decomposition step, decomposition starts from the threading dislocations Q1 of the bridging portion D31. The protective layer B31 is not decomposed. Thus, the decomposition layer C31 is decomposed in a region between the protective layer B31 and the flat portions D31*a* and the side portions D31*b*1 of the bridging portion D31, to thereby provide voids X4 between the protective layer B31 and the bridging portion D31.

Thus, the substrate can be readily separated from a semiconductor layer to be grown subsequently. When the substrate is not separated, the voids X4 can be utilized for improving a light extraction efficiency of a light-emitting device. Since the bridging portion D31 is appropriately supported by joining the bottom portion D31*b*2 and the protective layer B31, the flat portions D31*a* of the bridging portion D31 are very stable. Therefore, a semiconductor layer to be grown on the bridging portion D31 exhibits good crystallinity.

2-2. Formation of Dent Without Formation of Protective Layer

Example 3-3

Figure 28:
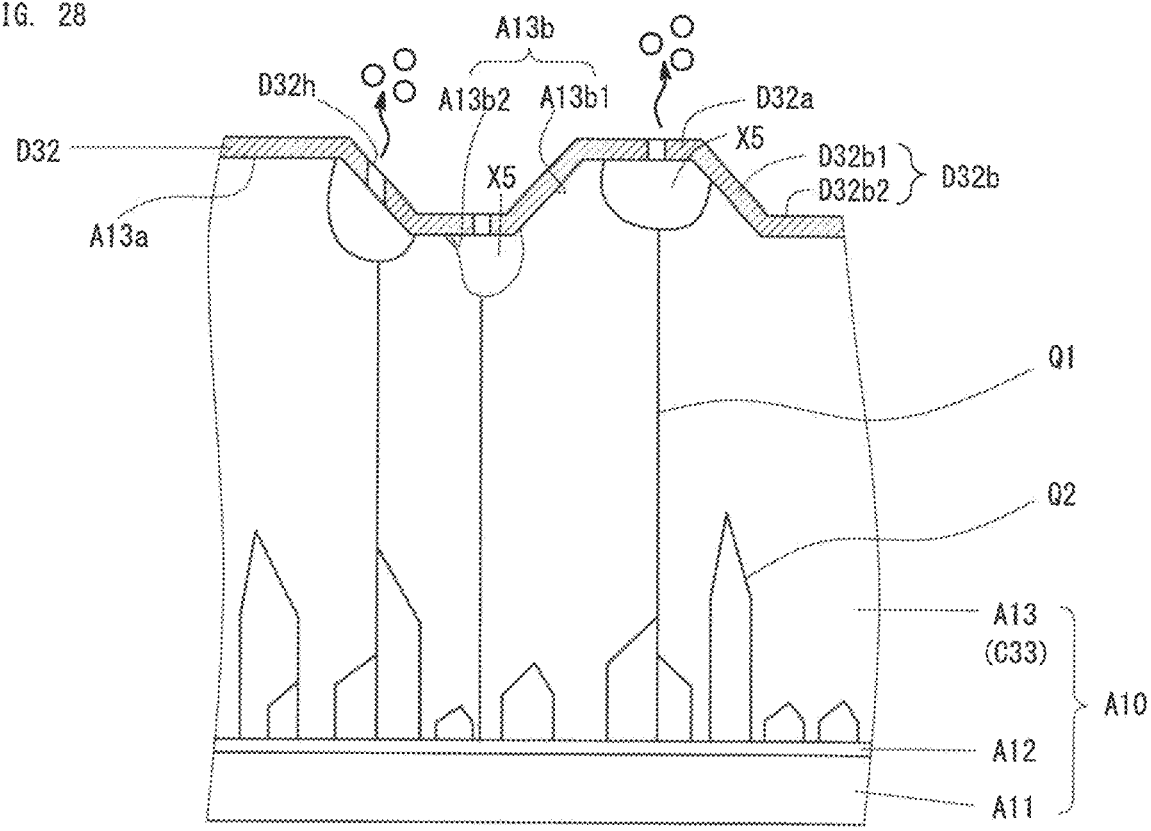
FIG. 28 illustrates a production method for a semiconductor device according to a modification of the third embodiment (part 2)

In the present embodiment, the protective layer and the decomposition layer are not formed in FIG. 27, and the decomposition layer is substituted for the GaN layer A13. FIG. 28 illustrates the case of formation of dents without formation of a protective layer. In this case, firstly, dents A13*b* are formed in the substrate A10 shown in FIG. 3. The dents A13*b* are arranged at the triangular lattice points as same as Examples 3-1 and 3-2. The GaN layer A13 has flat portions A13*a* and dents A13*b*. A bridging portion D32 with a uniform thickness is formed on the top surface of the GaN layer A13. The bridging portion D32 has flat portions D32*a* and dents D32*b*. Threading dislocations Q1 are exposed to the flat portions D32*a* and the side portions D32*b*1 of the dents D32*b*.

This production method includes a step of forming the dents A13*b* on the GaN layer A13 serving as a decomposition layer. The dent formation step involves formation, in the decomposition layer, the dents A13*b* each having a side portion A13*b*1 and a bottom portion A13*b*2. The bridging portion formation step involves formation of the bridging portion D32 having a shape corresponding to the dents A13*b*.

In the decomposition step, decomposition starts from the threading dislocations Q1 of the bridging portion D32. The GaN layer A13 is decomposed around the threading dislocations Q1. The bridging portion D32 is supported by a non-decomposed portion of the GaN layer A13, which slightly remains at a position away from the threading dislocations Q1.

Thus, the substrate can be readily separated from a semiconductor layer to be grown subsequently. When the substrate is not separated, the voids X5 can be utilized for improving a light extraction efficiency of a light-emitting device.

2-3. Side Portion of Dent

Example 3-4

Figure 29:
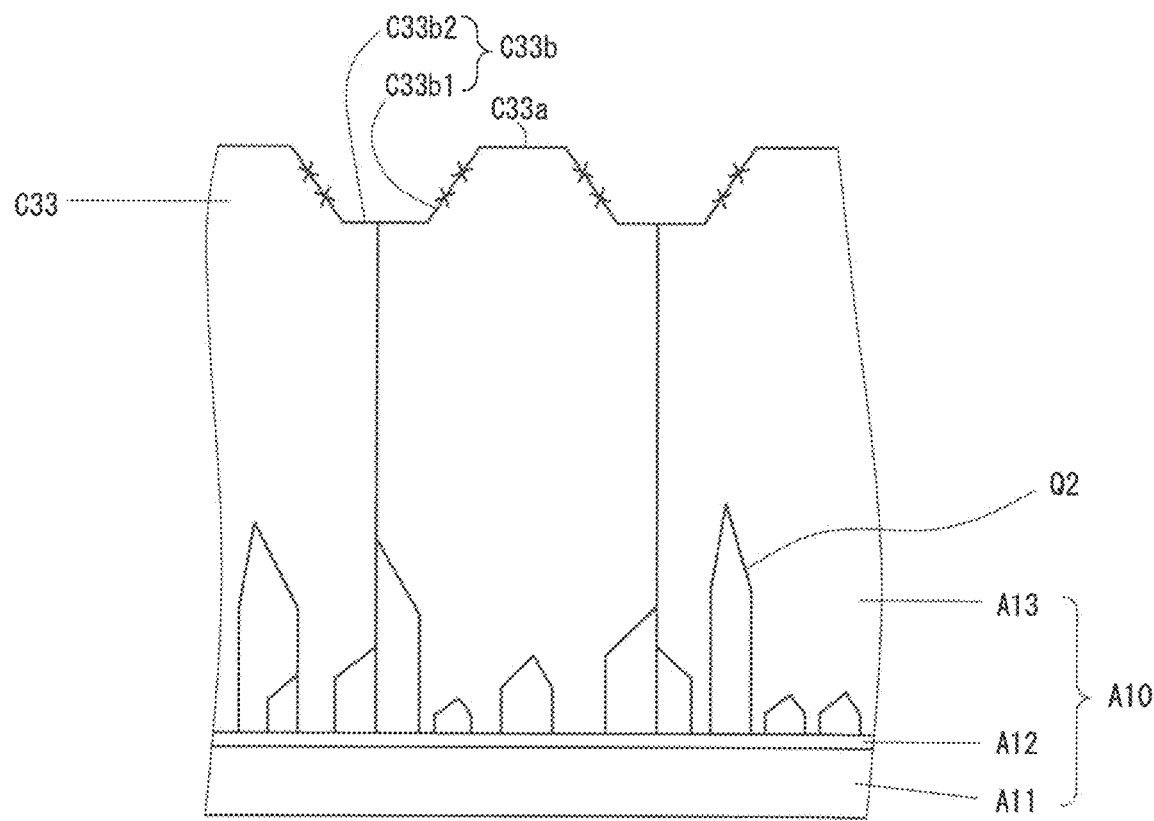
FIG. 29 illustrates a production method for a semiconductor device according to a modification of the third embodiment (part 3)

In the present example, the decomposition layer is decomposed not by threading dislocations but by damage intentionally formed on the surface. FIG. 29 illustrates the case of causing damage to side portions C33*b*1 of dents C33*b* of a decomposition layer C33. The dents C33*b* are arranged at the lattice points of triangular lattice, which is continuously disposed in a honeycomb structure. The decomposition layer C33 has top portions C33*a* and the dents 33*b* having side portions C33*b*1 and bottom portions C33*b*2. In the case where a photolithographic technique is used to form the dents 33*b*, a masked portion is not damaged, and an unmasked portion is more likely to be damaged. Damage can be achieved by setting the conditions for easily causing damage when sputtering or ICP (Inductively Coupled Plasma) etching is performed. Moreover, damage can be formed by irradiating the side portions C33b1 with a laser beam after etching. Alternatively, a highly reactive solution may be applied only to the side portions C33b1 after formation of the side portions C33b1.

Subsequently, a bridging portion D33 with a uniform thickness is formed along the surface of the decomposition layer C33 having the dents C33b. At this time, the area of the bridging portion D33 which is on the damaged portions of the decomposition layer C33 has poor crystallinity, i.e., damaged portions. The damaged portions of the bridging portion D33 and the decomposition layer C33 are easily etched in the subsequent decomposition step as well as the threading dislocations.

Figure 30:
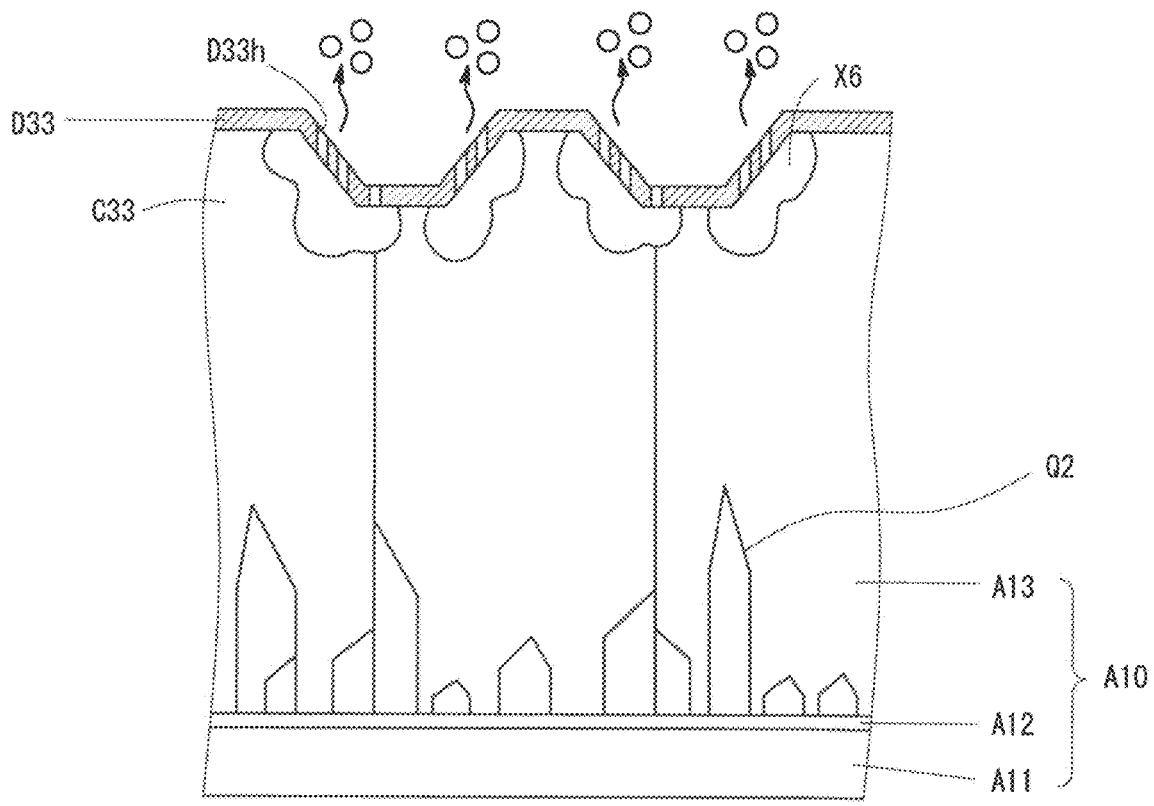
FIG. 30 illustrates a production method for a semiconductor device according to a modification of the third embodiment (part 4)

In the decomposition step, decomposition starts from damaged portions of the bridging portion D33 to make through holes D33h as shown in FIG. 30. Since the side portions C33b1 have damaged portions, the side portions C33b1 are more likely to be decomposed compared to other portions in the decomposition layer C33. This decomposition facilitates provision of voids X6 having a desired shape.

Thus, the substrate can be readily separated from a semiconductor layer to be grown subsequently. When the substrate is not separated, the voids X6 can be utilized for improving a light extraction efficiency of a light-emitting device.

2-4. Microdevice

Example 3-5

Figure 31:
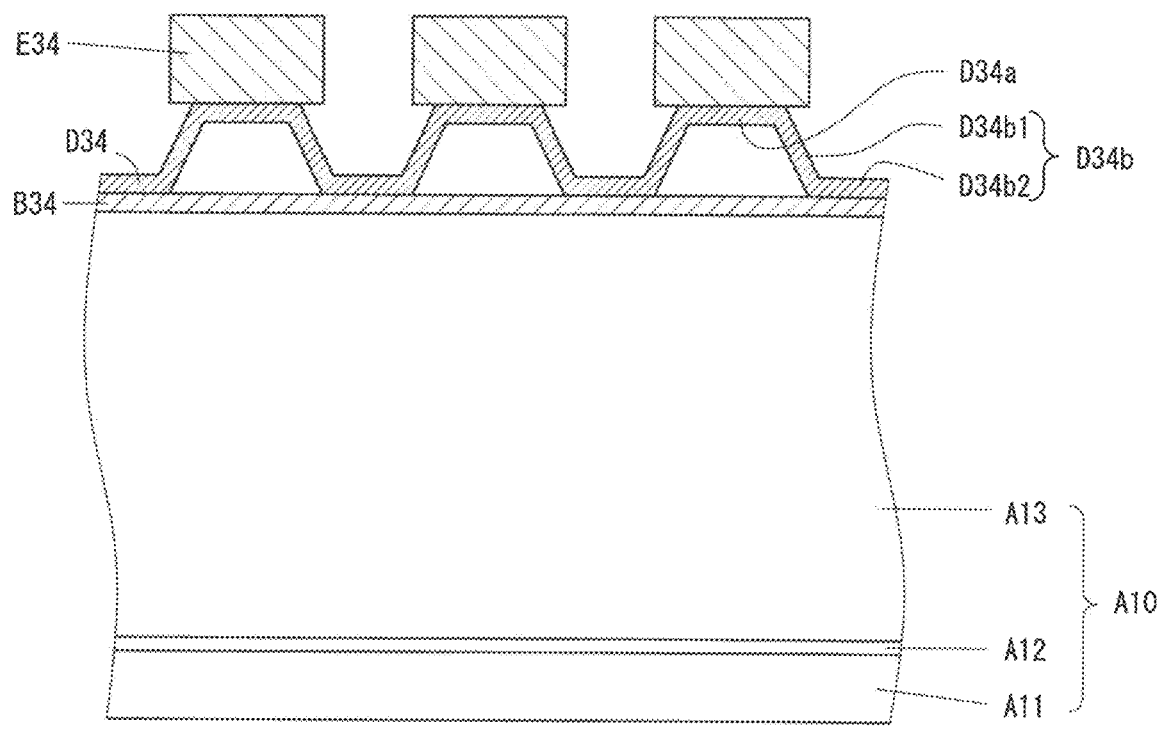
FIG. 31 illustrates a production method for a semiconductor device according to a modification of the third embodiment (part 5)

In the present example, a microdevice is formed on the bridging portion D34 of the structure shown in FIG. 27. As shown in FIG. 31, an uneven bridging portion D34 is disposed on a flat protective layer B34. The bridging portion D34 has top portions D34a and dents D34b having side portions D34b1 and bottom portions D34b2. A semiconductor layer E34 is grown from each top portion D34a of the bridging portion D34. Thus, the semiconductor layer formation step involves growth of the semiconductor layers E34 from the top portions D34a of the bridging portion D34.

2-5. Combination

The third embodiment and modifications thereof may be used in combination with the other embodiments and modifications thereof.

3. Summary of Third Embodiment

As described above in detail, the semiconductor device production method of the third embodiment involves formation of the dents C30b in the decomposition layer C30. Accordingly, the uneven bridging portion D30 can be formed on the decomposition layer C30. Thus, voids can be provided between the protective layer B30 and the bridging portion D30. The presence of the voids facilitates the separation of the semiconductor device from the growth substrate. The thus-produced semiconductor device does not include a heterogeneous substrate having a lattice constant considerably different from that of the semiconductor layer. Thus, a stress is sufficiently relaxed in the semiconductor device.

1. Experiment A 1-1. Substrate

Figure 32:
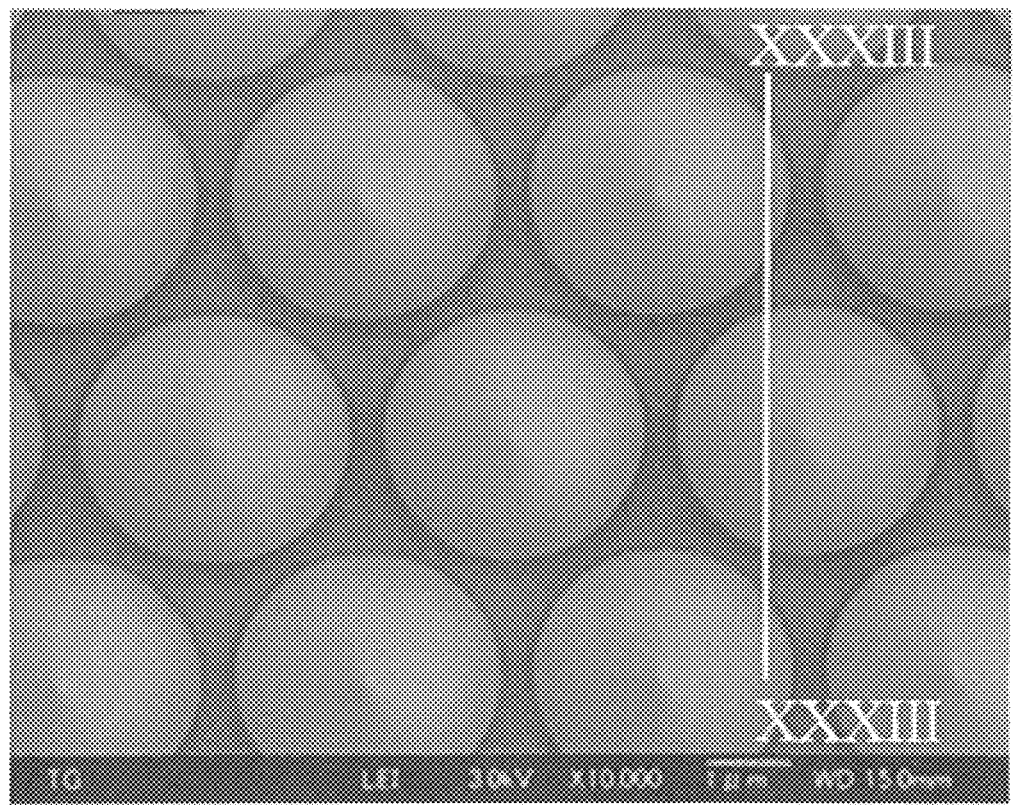
FIG. 32 is a scanning micrograph showing the surface of an uneven sapphire substrate used in experiments A to C.
Figure 33:
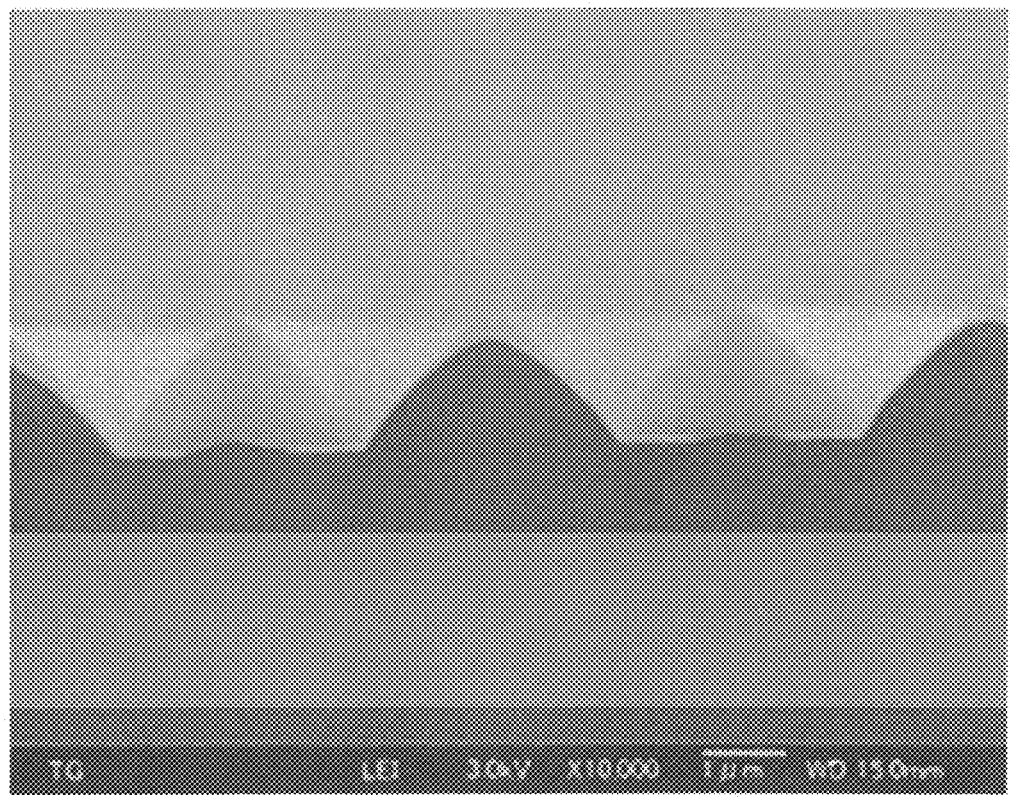
FIG. 33 is a cross-sectional view taken along line XXXIII-XXXIII of FIG. 32.

FIG. 32 is a scanning micrograph showing the surface of an uneven sapphire substrate. FIG. 33 is a cross-sectional view taken along line XXXIII-XXXIII of FIG. 32. As shown in FIGS. 32 and 33, a plurality of conical protrusions are arranged in a honeycomb pattern.

1-2. Decomposition Layer

Figure 34:
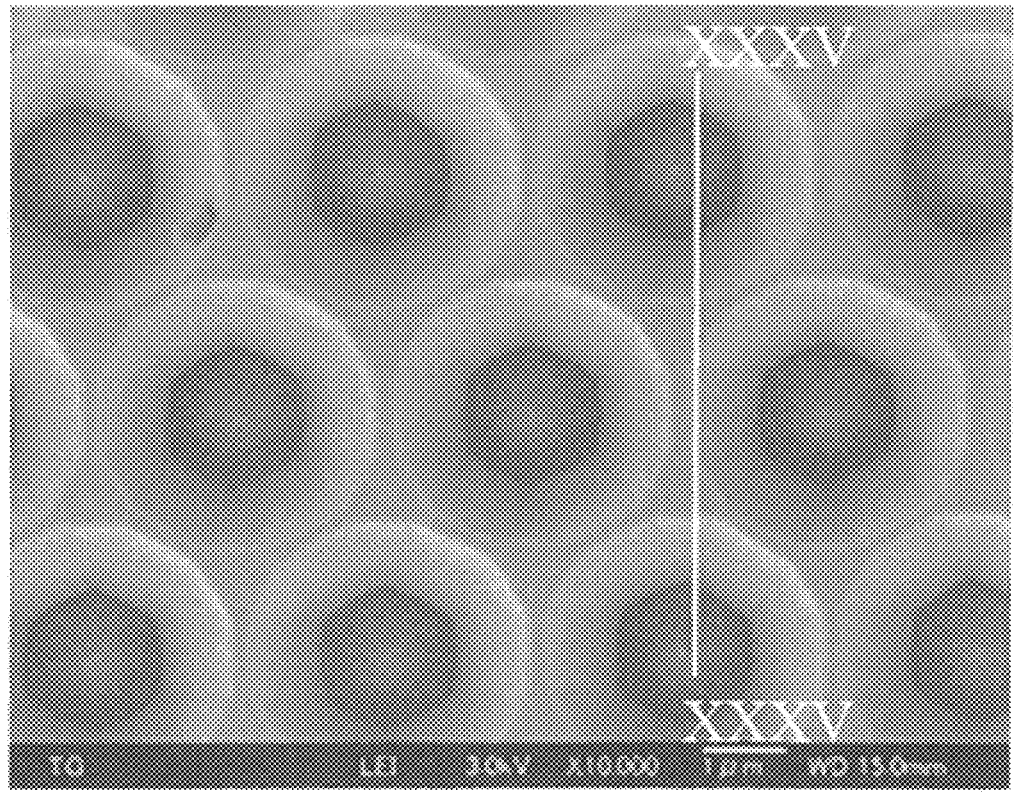
FIG. 34 is a scanning micrograph showing the surface of a structure including a sapphire substrate on which a buffer layer, a decomposition layer, and a bridging portion are formed in experiment A.
Figure 35:
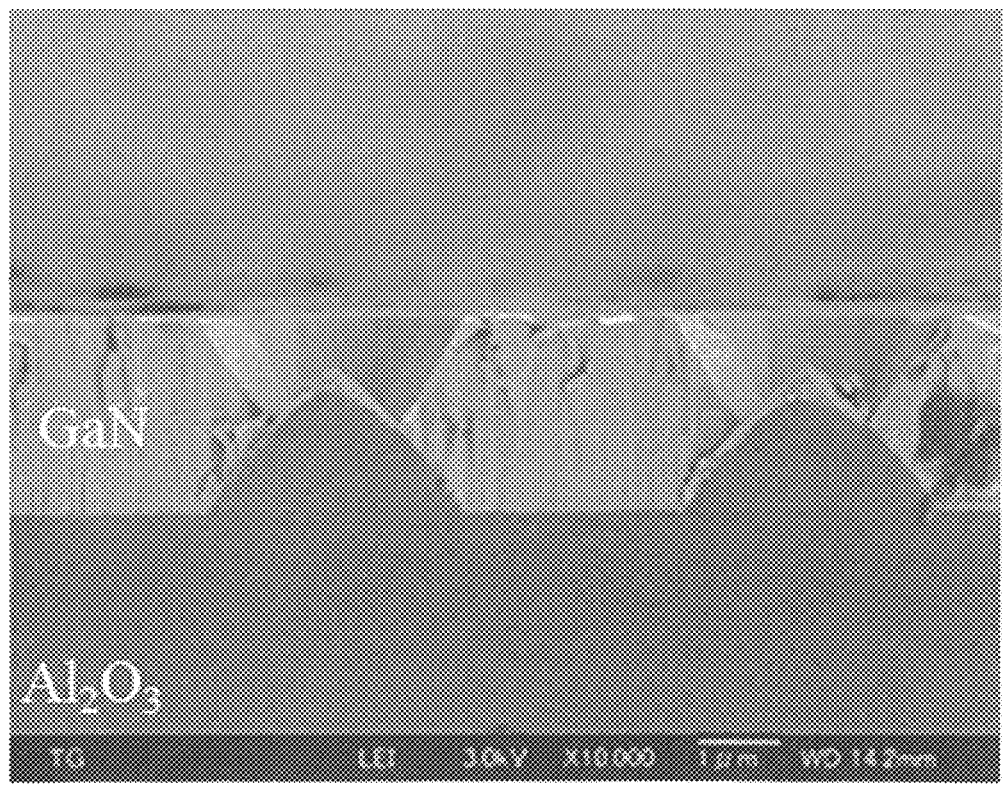
FIG. 35 is a cross-sectional view taken along line XXXV-XXXV of FIG. 34.

FIG. 34 is a scanning micrograph showing the surface of a structure including a sapphire substrate on which a buffer layer, a decomposition layer, and a bridging portion are formed. FIG. 35 is a cross-sectional view taken along line XXXV-XXXV of FIG. 34. The decomposition layer was formed from GaN. The bridging portion was formed from AlN through sputtering. The sputtering time was 50 seconds. The AlN bridging portion has a thickness of 14.3 nm.

1-3. Etching of Decomposition Layer

Figure 36:
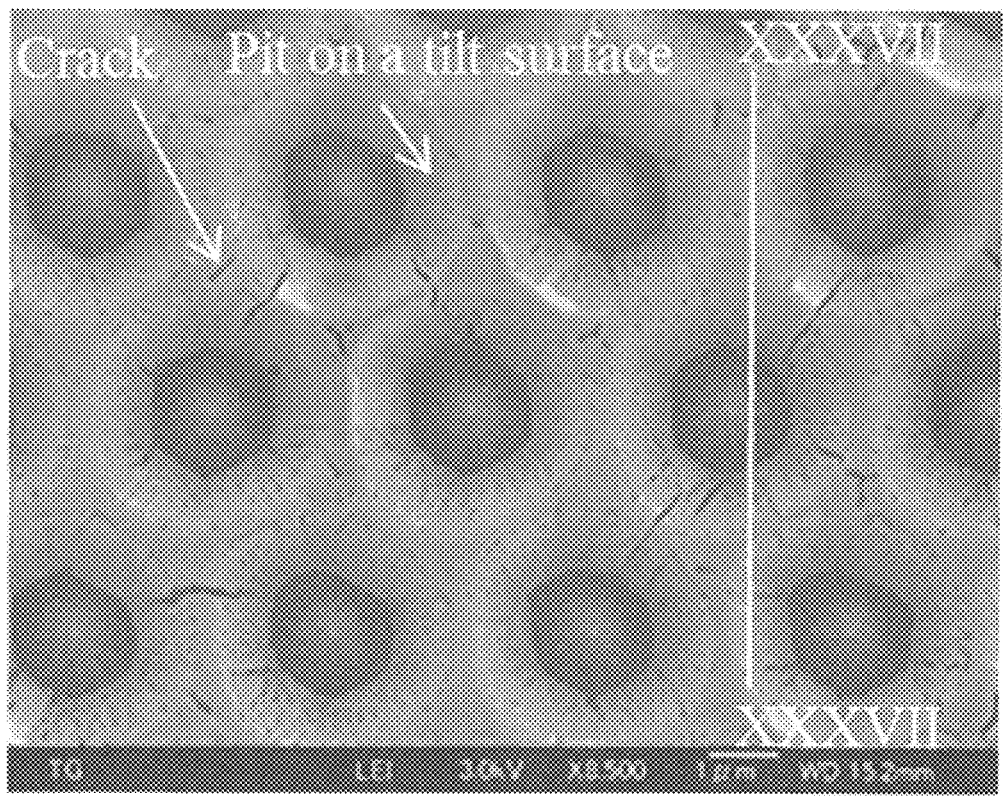
FIG. 36 is a scanning micrograph showing the surface of, for example, the bridging portion after decomposition of the decomposition layer in experiment A.

FIG. 36 is a scanning micrograph showing the surface of, for example, the bridging portion after etching of the decomposition layer. As shown in FIG. 36, cracks are generated partially in the bridging portion D10. Cracks are probably generated during etching or cooling. Thus, cracks are less likely to be generated if the etching and film formation processes are continuously performed. Since the bridging portion D10 is stable as a whole, the semiconductor layer above the bridging portion D10 can be grown without causing any problem.

Figure 37:
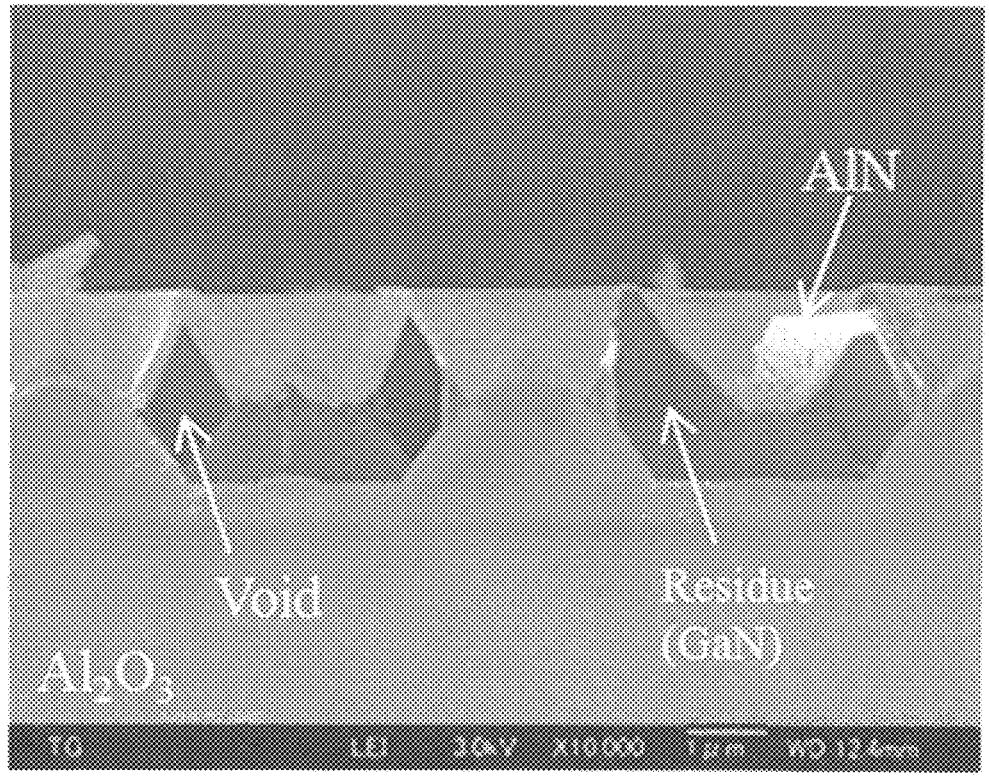
FIG. 37 is a cross-sectional view taken along line XXXVII-XXXVII of FIG. 36.

FIG. 37 is a cross-sectional view taken along line XXXVII-XXXVII of FIG. 36. As shown in FIG. 37, voids are observed on the left side, and a residue of the GaN decomposition layer is observed on the right side.

2. Experiment B 2-1. Formation of Layers (Including Decomposition Layer)

The same uneven substrate as in experiment A was used in experiment B. A GaN layer (decomposition layer) was formed through MOCVD. An AlGaN layer (bridging portion) was formed through MOCVD. The Al composition ratio of the AlGaN layer was 35 molar %. The thickness of the AlGaN layer was 25.8 nm.

2-2. Etching of Decomposition Layer

Figure 38:
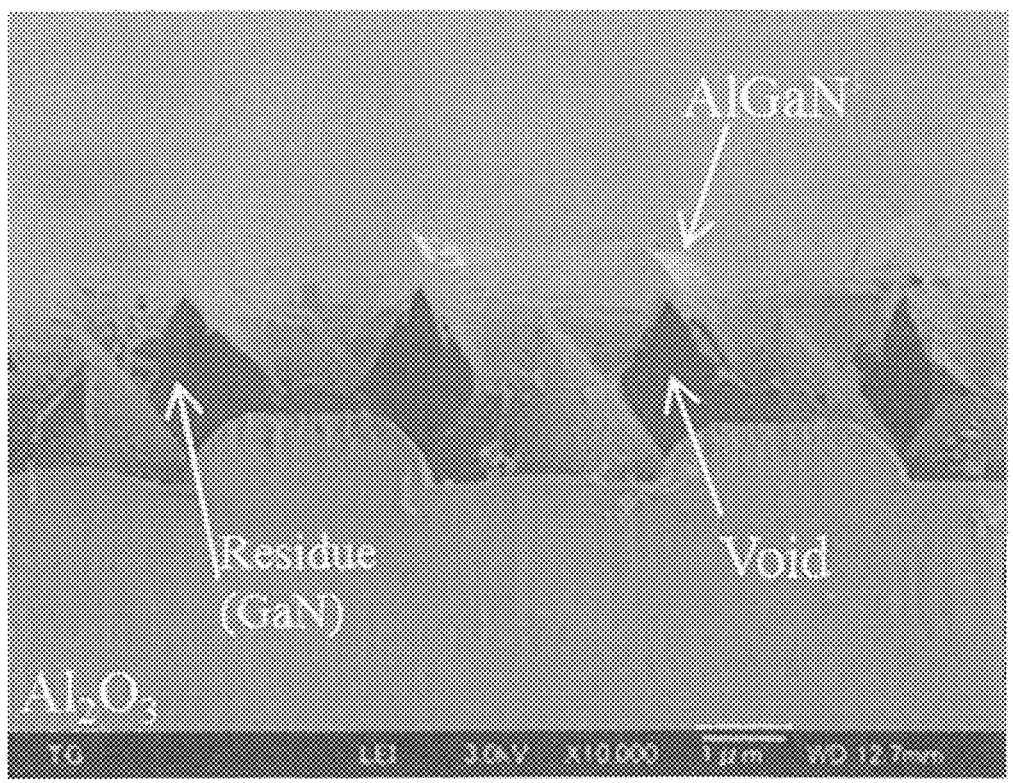
FIG. 38 is a scanning micrograph showing a cross section in the case of formation of an AlGaN layer for a bridging portion in experiment B.

FIG. 38 is a scanning micrograph showing a cross section in the case of formation of an AlGaN layer for a bridging portion. Even if the bridging portion is formed of an AlGaN layer, voids can be provided. In the case where the decomposition layer was formed of a GaN layer, the bridging portion was able to be formed of an AlGaN layer having an Al composition ratio of 5 molar % to 35 molar %.

In the case where the bridging portion is formed of an AlGaN layer, the composition of the bridging portion is similar to that of the decomposition layer when the Al composition ratio of the AlGaN layer is low. In such a case, the difference in lattice constant is reduced between the bridging portion and the decomposition layer. Thus, generation of cracks can be prevented. However, in such a case, the thermal decomposition temperature of the bridging portion is approximate to that of the decomposition layer. Thus, the bridging portion may undergo damage during thermal decomposition of the decomposition layer. Meanwhile, the composition of the bridging portion differs from that of the decomposition layer when the Al composition ratio of the AlGaN layer is high. In such a case, the bridging portion can be prevented from undergoing damage during thermal decomposition of the decomposition layer, but cracks are likely to be generated.

3. Experiment C 3-1. Formation of Layers (Including Decomposition Layer)

The same uneven substrate as in experiment A was used in experiment C. A GaN layer (decomposition layer) was formed through MOCVD. A low-temperature formed AlN layer (bridging portion) was formed through MOCVD at a low temperature of 300° C. to 600° C. The thickness of the low-temperature formed AlN layer was 25.8 nm.

3-2. Etching of Decomposition Layer

Figure 39:
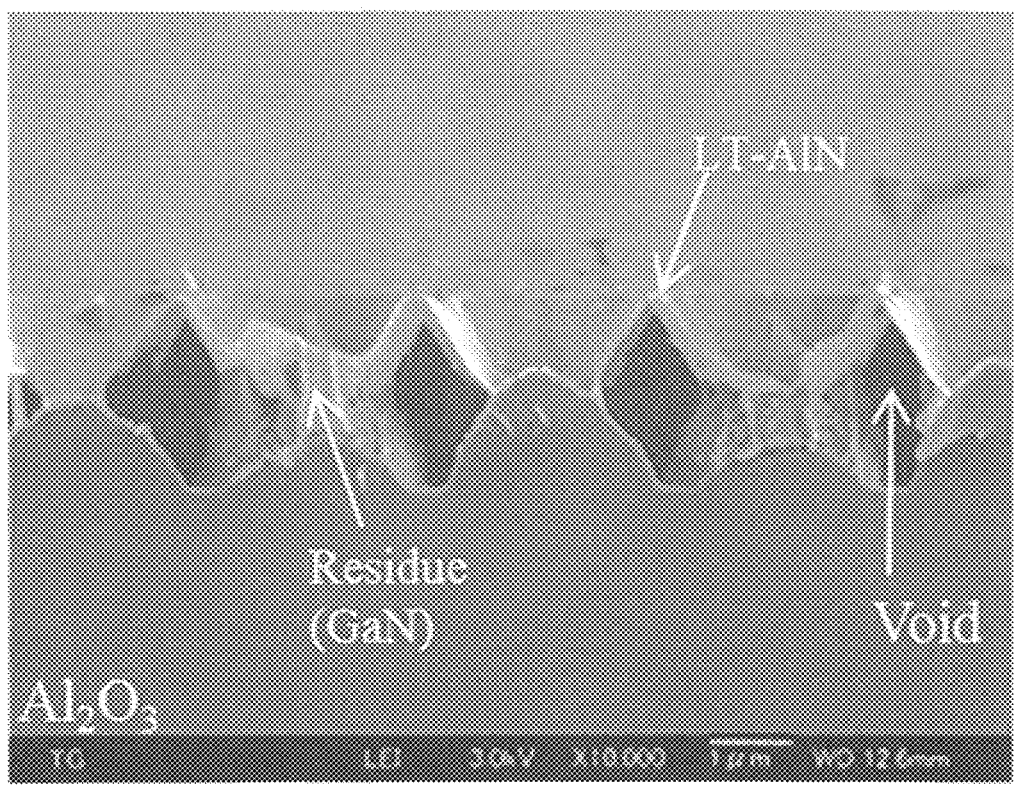
FIG. 39 is a scanning micrograph showing a cross section in the case of formation of a low-temperature AlN layer for a bridging portion in experiment C.

FIG. 39 is a scanning micrograph showing a cross section in the case of formation of a low-temperature formed AlN layer for a bridging portion. Even if the bridging portion is formed of a low-temperature formed AlN layer, voids can be provided.

4. Summary of Experiments

As described above, through holes can be provided at the threading dislocations of the bridging portion, to thereby decompose the decomposition layer in the interior of the through holes. Thus, the techniques according to the first to third embodiments and modifications thereof described in the present specification can be implemented.

What is claimed is:

1. A method for producing a semiconductor, the method comprising:
   forming a decomposition layer, which comprises a plurality of threading dislocations, above a substrate;
   forming a bridging portion on the decomposition layer, a surface of the bridging portion exposing the threading dislocations;
   keeping a substrate temperature within a range of a temperature equal to or higher than a thermal decomposition temperature of the decomposition layer and lower than a thermal decomposition temperature of the bridging portion as a decomposition process, after the forming of the bridging portion;
   thermally decomposing the threading dislocations and forming a plurality of through holes penetrating the bridging portion in the decomposition process;
   thermally decomposing the decomposition layer from the threading dislocations and forming a plurality of voids in the decomposition layer in the decomposition process; and
   forming at least one semiconductor layer on the bridging portion after forming the plurality of voids.

2. The method for producing a semiconductor according to claim 1, the method further comprising:
   forming a protective layer which is not decomposed in the decomposition process, on which the decomposition layer is formed.

3. The method for producing a semiconductor according to claim 2, the method further comprising:
   forming a pit layer having a V-shaped pit, on which the protective layer is formed; wherein
   the protective layer is formed on an entire surface of the pit layer along a surface shape of the V-shaped pit and the protective layer comprises a V-shaped concave corresponding to the V-shaped pit.

4. The method for producing a semiconductor according to claim 3, wherein the decomposition layer fills the V-shaped concave of the protective layer and a surface of the decomposition layer is flat.

5. The method for producing a semiconductor according to claim 3, wherein the decomposition layer is formed along a surfaces of the V-shaped concave of the protective layer and a V-shape is remained on a surface of the decomposition layer.

6. The method for producing a semiconductor according to claim 2, the method further comprising:
   forming a dent in the decomposition layer, wherein
   the dent comprises a side portion and a bottom portion in the decomposition layer; and
   the bridging portion comprises a shape corresponding to a shape of the dent.

7. The method for producing a semiconductor according to claim 6, wherein a surface of the protective layer is flat, and the bottom portion of the dent in the decomposition layer does not expose the protective layer.

8. The method for producing a semiconductor according to claim 6, wherein a surface of the protective layer is flat, and the bottom portion of the dent in the decomposition layer expose the protective layer.

9. The method for producing a semiconductor according to claim 2,
   wherein a surface of the protective layer is flat, a surface of the decomposition layer is flat and a surface of the bridging portion is flat.

10. The method for producing a semiconductor according to claim 2, wherein a surface of the protective layer is flat, the decomposition layer comprises a V-shaped pit, and the bridging portion is formed on an entire surface of the decomposition layer along a surface shape of the V-shaped pit and the bridging portion comprises a V-shaped concave corresponding to the V-shaped pit.

11. The method for producing a semiconductor according to claim 1, wherein a surface of the decomposition layer is flat and a surface of the bridging portion is flat.

12. The method for producing a semiconductor according to claim 1, wherein the decomposition layer comprises a V-shaped pit, and the bridging portion is formed on an entire surface of the decomposition layer along a surface shape of the V-shaped pit and the bridging portion comprises a V-shaped concave corresponding to the V-shaped pit.

13. The method for producing a semiconductor according to claim 1, the method further comprising:
   forming a dent in the decomposition layer, wherein
   the dent comprises a side portion and a bottom portion in the decomposition layer; and
   the bridging portion comprises a shape corresponding to a shape of the dent.

14. The method for producing a semiconductor according to claim 1, the method further comprising:
   forming a dent having a side portion and a bottom portion in the decomposition layer; and
   causing damage to the side portion of the dent.

15. The method for producing a semiconductor according to claim 1, the method comprising:
   providing a template substrate having a decomposition layer.

16. The method for producing a semiconductor according to claim 1, wherein the decomposition layer is a GaN layer or an InGaN layer, and the bridging portion is formed of an Al-containing Group III nitride semiconductor layer.

17. The method for producing a semiconductor according to claim 1, the method further comprising:
   separating the substrate from the semiconductor layer.

18. The method for producing a semiconductor according to claim 1, wherein at least $H_2$ gas is supplied for etching the decomposition layer in the decomposition process.

19. The method for producing a semiconductor according to claim 18, wherein at least one of $N_2$ gas and $NH_3$ gas is supplied in the decomposition process.

* * * * *